United States Patent [19]

Hirono

[11] Patent Number: 5,795,177
[45] Date of Patent: Aug. 18, 1998

[54] MOUNTING MECHANISM OF COMPONENTS, MOUNTING MECHANISM OF UNIT AND METHOD OF MOUNTING COMPONENTS

[75] Inventor: Tetsuro Hirono, Tokyo, Japan

[73] Assignee: Mitsubishi Denki Kabushiki Kaisha, Tokyo, Japan

[21] Appl. No.: 692,036

[22] Filed: Aug. 2, 1996

[30]     Foreign Application Priority Data

Aug. 25, 1995   [JP]   Japan ..................... 7-217437
Mar. 29, 1996   [JP]   Japan ..................... 8-077506

[51] Int. Cl.$^6$ ................................................. H01R 13/64
[52] U.S. Cl. ...................... 439/378; 439/247; 439/157
[58] Field of Search ............................. 439/157, 378, 439/247, 248, 377, 374

[56]     References Cited

U.S. PATENT DOCUMENTS

| | | | |
|---|---|---|---|
| 4,980,800 | 12/1990 | Furuta | 439/378 |
| 5,045,960 | 9/1991 | Eding | 360/97.01 |
| 5,205,752 | 4/1993 | Taguchi et al. | 439/157 |
| 5,600,542 | 2/1997 | Malgouires | 439/157 |

FOREIGN PATENT DOCUMENTS

| | | |
|---|---|---|
| 0527608 | 2/1993 | European Pat. Off. . |
| 7-20953 | 2/1993 | Japan . |
| WO91/20083 | 12/1991 | WIPO . |

*Primary Examiner*—Gary F. Paumen
*Attorney, Agent, or Firm*—Wolf, Greenfield & Sacks, P.C.

[57]     ABSTRACT

It is an object of the present invention to remove an applied force generated at the time of combining connectors due to a close tolerance of components which compose a mounting mechanism of a unit, which is based on the SCA method. A tray carrying a magnetic disk unit has a guide pin having a thick body portion and a thin body portion. A back panel, which is under a floating condition, so as to be movable up and down, left and right and backward and forward, is mounted on a frame. The back panel has a guide hole to guide the guide pin. When the tray is being inserted to the frame carrying the magnetic disk unit, the thick body of the guide pin is guided by the guide hole and position setting of the connector of the magnetic disk unit and the connector of the back panel is performed. Furthermore, when the tray is being inserted to the end of the frame, the thin body of the guide pin passes the guide hole and the connectors are connected.

6 Claims, 34 Drawing Sheets

10 : GUIDE PIN

31 : CAM MOUNTING GAP

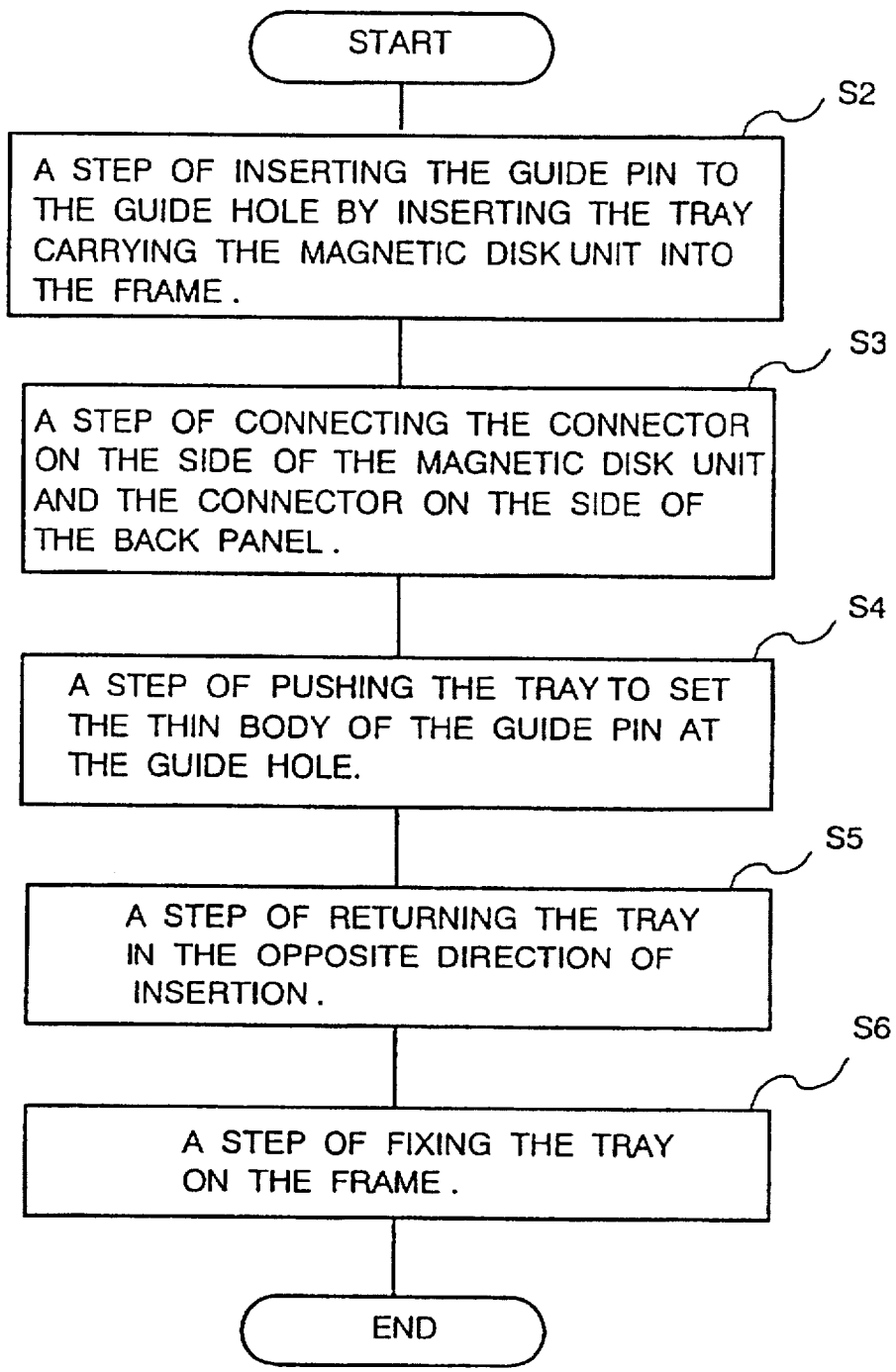

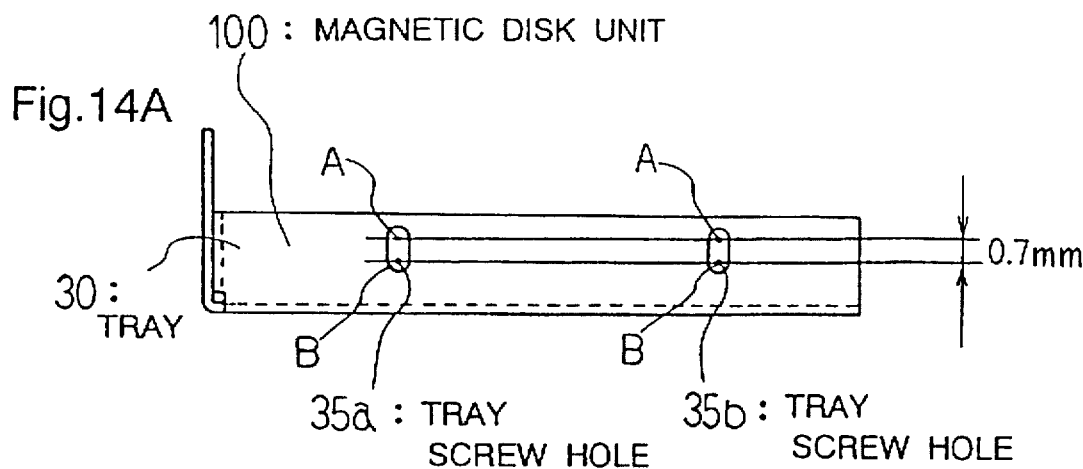
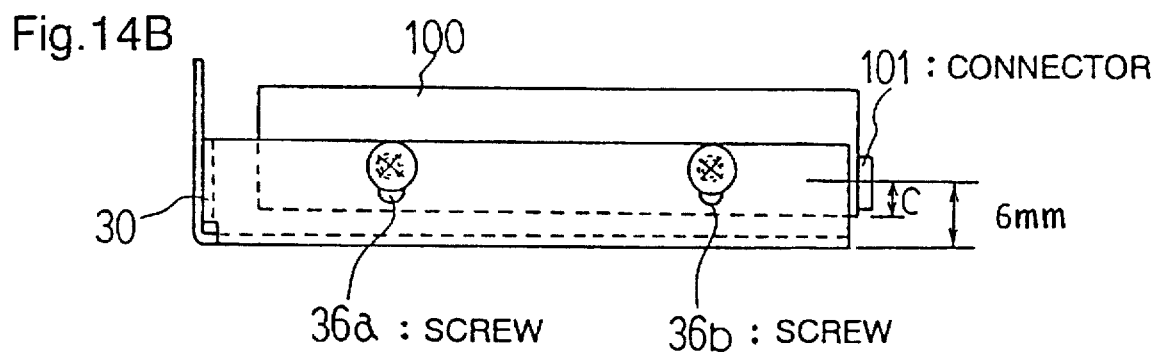
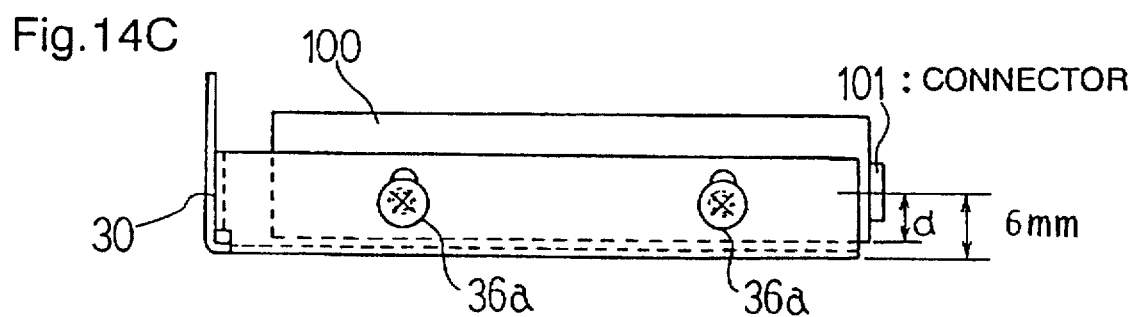

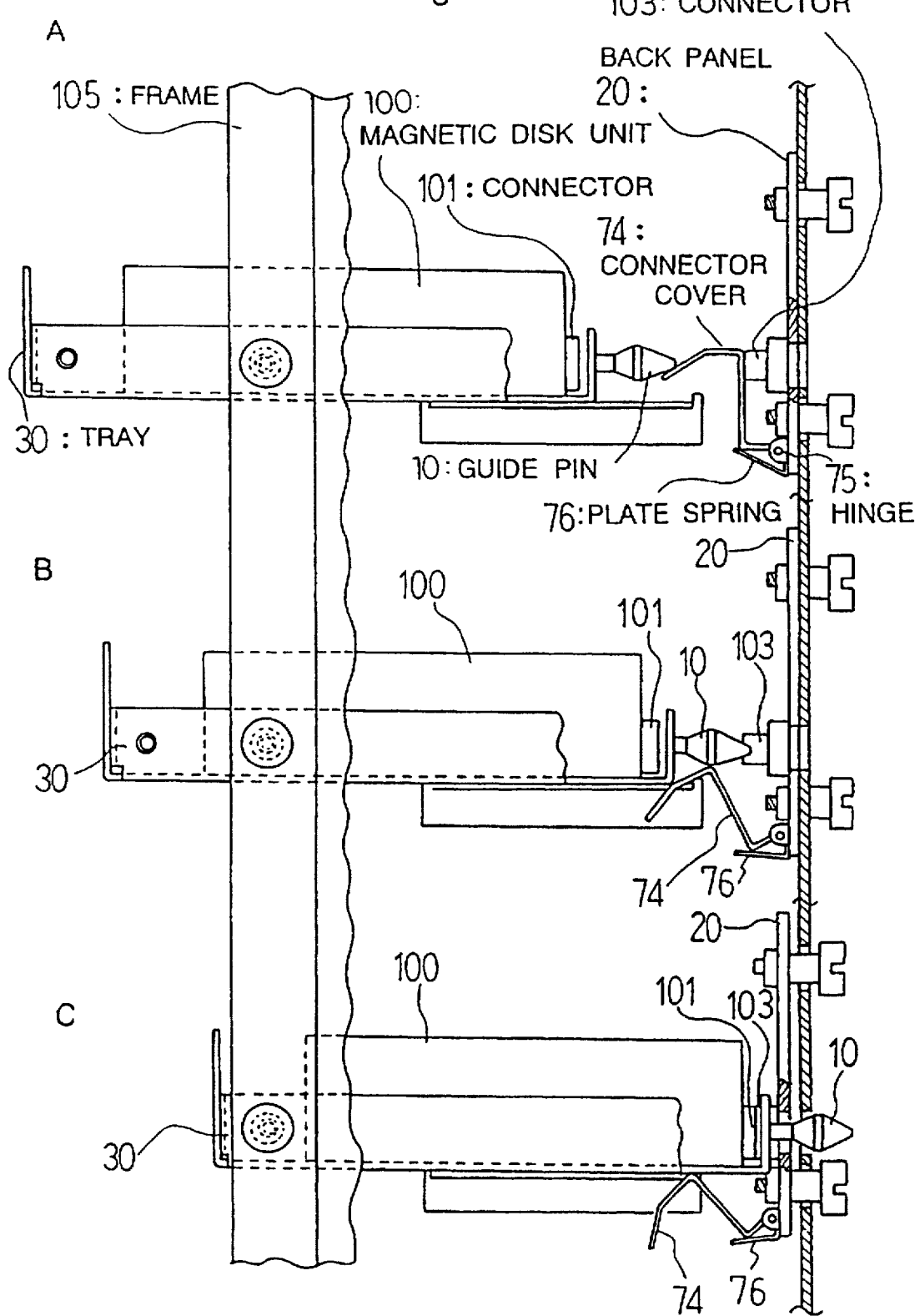

$\phi D - \phi d \geqq 1.0 \text{ mm}$

MOUNTING MECHANISM OF COMPONENTS, MOUNTING MECHANISM OF UNIT AND METHOD OF MOUNTING COMPONENTS

BACKGROUND OF THE INVENTION

1. Field of the Invention

This invention relates to a mounting mechanism for components in electronic equipment and a mounting mechanism and method for mounting a magnetic disk unit. More specifically, this invention relates to a mounting mechanism of the magnetic disk unit in accordance with "Single Connector Attachment for SCSI Disk Drives". "Single Connector Attachment for SCSI Disk Drives" is defined by Sun Microsystems, Nov. 9, 1992, pages 9 to 18, Single Connector Attachment, Revision 1.

2. Description of the Related Art

FIG. 28 shows a mounting mechanism of a conventional magnetic disk unit.

The conventional magnetic disk unit has a connector 99a of a signal and a connector 99b of a power source, respectively. External sizes of these components differ from each other. Therefore, as shown in FIG. 28, the connector is needed to connect a magnetic disk unit 95 and a back panel 91 through a relay board 94.

Signal lines of the magnetic disk unit 95 and the relay board 94 are connected via a signal cable 93. The power source line of the magnetic disk unit 95 and the relay board 94 are connected via a power source cable 93a. The relay board 94 is mounted on a tray 98 with a screw 97. By inserting the tray 98 carrying the magnetic disk unit 95 and the relay board 94 to a frame 90, a guide pin 92a mounted on the connector 92 of the back panel and a guide hole 96a mounted on a connector 96 of the relay board guide the connector 96 of the relay board and the connector 92 of the back panel and connect them.

As has been described, conventionally, in the magnetic disk unit which separates the connector of the signal and the connector of the power source, the relay board was required for connecting the magnetic disk unit and the back panel.

For the purposes of simplifying and downsizing the attached or removed mechanism of the magnetic disk unit, the Single Connector Attachment for SCSI Disk Drives (hereinafter, referred to as the SCA specification) is proposed, wherein the connectors of the signal and the power source are combined.

FIG. 29 shows a mounting mechanism of the magnetic disk unit according to the SCA specification. FIG. 29 shows an array configuration wherein the mounting mechanisms of the magnetic disk units are arranged in the vertical direction in the frame.

A magnetic disk unit 100 is carried on a tray 104 as a conventional magnetic disk unit which separates the connector of the signal and the connector of the power source. However, the relay board is not provided. In a case where the number of the magnetic disk units to be mounted increases, according to the accumulation of the tolerance of the size of the involved magnetic disk units in the system, the positioning error of the connectors of the magnetic disk unit and the back panel becomes large and they may not be able to be connected. Therefore, the back panel 102 is provided for each magnetic disk unit so that the mounting system closes in each magnetic disk unit. Each back panel is embedded into the frame 105 with a screw 22. The screw 22 has a fat portion 22a and a portion 22b where the screw is cut off. The outside diameter of the fat portion 22a of the screw 22 is smaller than the inside diameter of the mounting hole of the back panel. Thus, the back panel is mounted on the frame and is able to be moved a fixed amount up and down, left and right, and back and forth. That is, the back panel 102 is mounted under a floating condition. The back panel 102 under the floating condition is connected with a cable 109.

The procedure of mounting the magnetic disk unit 100 is as follows. The tray 104 carrying the magnetic disk unit 100 is inserted into the frame 105. By using a pushing lever 106, the tray 104 is inserted in the direction of the back panel. The tray 104 is then guided by the guide pin 107 mounted on the tray and the guide hole 108 of the back panel. Thus, the connector 101 of the magnetic disk unit and the connector 103 of the back panel are connected.

As has been described, since the magnetic disk unit of according to the SCA specification can connect the signal and the power source with one connector, the relay board is not required. Consequently, the mounting mechanism of the magnetic disk units can be downsized.

FIG. 30 shows the external size of the magnetic disk unit as it appears in FIG. 2 from page 11 of the Revision of the SCA specification.

In the Figure, the X dimension is a depth direction of the magnetic disk unit. The Y dimension is a width direction of the magnetic disk unit. The Z dimension is the height direction of the magnetic disk unit.

On page 10, the SCA specification states that describing the position of the Z dimension of the connector, "in the Z dimension, a small amount of variation among drive vendors or models is allowed."

Then, as shown in block 200 of FIG. 30, the position of the Z dimension in the center of the connector can be set in two ways. It can be set to be either 0.096 inch (2.46 mm) or 0.069 inch (1.75 mm), which dimensions differ 0.027 inch (about 0.7 mm) from each other, from a mounting screw hole on the side face H1.

As a tolerance of the position in the Z dimension of the connector, as shown in a block 200, +—0.020 inch (about 0.5 mm) is prescribed to each size of 0.096 inch (2.46 mm) or 0.069 inch (1.75 mm).

Furthermore, as the specification of the position in the Y dimension of the connector, the SCA specification, on page 10, says "The connector is flush with the end of the drive in the Y dimension". The position in the Y dimension of the end face of the connector is the same surface of the end face of the magnetic disk unit. In FIG. 2, the length of the end face of the magnetic disk unit from the standard screw hole is prescribed to be 1.620 inch +—0.027 inch (41.15 mm +—0.68 mm), from the nearest screw hole at the bottom face of the magnetic disk unit. However, Revision 3.0 of SCA specification does not refer to a tolerance of +—0.027 inch (+—0.68 mm) anymore.

As shown in FIG. 31A, when the connector 101 of the magnetic disk unit 100 and the connector 103 of the back panel 102 are coupled, page 10 of the SCA specification says "When the SCA disk drive is mated to a vertical board mount socket, there is 3.45+—0.7 mm clearance between the disk drive and the mated back plane" and a tolerance of +—0.7 mm is allowed.

A variation of a size of an industrial product is assumed to be similar to a normal distribution in general. For instance, when a defiance of +—0.7 mm is a variation of the product, it can be shown on a normal distribution table as shown in FIG. 31B. Generally, the industrial product is distributed within a range of +—3σ in the normal distribution table.

What the values nσ and +0.6 of FIG. 31B mean is described in detail in Embodiment 1.

Problems to be solved by the Invention

Problem 1

In the SCA specification, a tolerance in the Z dimension of the connector of +−0.020 inch (about 0.5 mm) is allowed.

FIGS. 32A and 32B show a case where the connector 101 is shifted backward by 0.5 mm to the connector 103. In FIG. 32A, a line "a" shows a center of the connector 103. A line "b" shows a center of the connector 101.

The SCA specification states "The connector has been modified to allow for 0.040 inch of alignment tolerance along the X and Z axes" on page 17. When the center of the alignment tolerance (0.040 inch=about 1 mm) shown here is a center value used in design, the connectors can be engaged even though there is a positioning error of +−0.5 mm. Therefore, when the tray 104 is being pushed, by being guided by the guide pin 107 and the guide hole 108, the connectors 101 and 103 begin to be engaged with being shifted by 0.5 mm from each other. Since the back panel 102 is under the floating condition, the guide pin 107 and the guide hole 108 are engaged by moving the back panel in a direction to reduce the amount of the positioning error of the connector. After a gap between the guide pin 107 and the guide hole 108 becomes 0, the back panel 102 moves in the direction of arrow A up to the maximum movable range for position matching. There may be positioning error between the connectors even after the gap between the guide pin 107 and the guide hole 108 becomes 0. In this case, the connector 101 and the connector 103 are engaged under the condition that the board 100a of the magnetic disk unit which mounts the connector 101 by soldering to the connector 101 flexes and changes its form as shown in arrow B of FIG. 32B. Therefore, stresses are added to (1) the connecting parts 101C and 103C of the connectors 101 and 103, (2) the junction 101a of the connector 101 and the board 100a, (3) a board and (4) a junction 103a of the connector 103 and the back panel 102. The connection is performed under the stress.

This means defective connection of the connectors and inferiority of the soldering part is likely to occur.

Problem 2

In FIG. 29, when a tray 104 is being pushed in, the magnetic disk unit 100 pushes the back panel 102 to align with a screw 22 via the connector 101. Under such a condition, the connectors 101 and 103 support the magnetic disk unit. However, the above condition goes against the rule that mechanical support of the magnetic disk unit is performed by other than the connector. This is described in the specification as "The SCA connector provides the necessary electrical connection but mechanical stability and device retention must be provided by other mechanisms, including brackets, guide rails, clips, or screw attachments", which appears on page 9 of SCA specification.

Problem 3

The SCA specification (Revision 1) says "The connector is flush with the end of the drive in the Y dimension" on page 10. This is the specification of the position of the connector in the Y dimension. In FIG. 2 in the specification (as shown in FIG. 30), the length from the center of the nearest screw hole at the bottom face to the end of the bottom face of the magnetic disk unit is specified as 1.620 inch +−0.027 inch (41.15 mm +−0.68 mm). However, in the Revision 3.0 of SCA specification, a tolerance of +−0.027 inch (+−0.68 mm) is not clarified.

In the mounting mechanism of the magnetic disk unit as shown in FIG. 29, by inserting the tray 104, the connector 101 of the magnetic disk unit is pushed into the connector 103 of the back panel and connected. Therefore, the pressure to push the tray 104 is transmitted directly to the back panel 102 and the connector 101 and the connector 103 are connected under the condition that a warp occurs in the back panel 102. When a large force is added to the back panel 102, the back panel 102 becomes largely warped. This means that a component mounted in the back panel 102, for example, the connector 103, is likely to become unsoldered because of the stress.

In order to avoid this, there is a method of controlling the warp of the back panel 102 to be less than a fixed amount by receiving the tray 104 at a fixed position by a mechanical stopper not shown in the figure. In FIG. 29, a magnetic disk unit 100 is fixed to a tray with a screw hole of the bottom face of the magnetic disk unit. In this case, as mentioned above, in Revision 3.0, the size tolerance from the position of the screw hole of the magnetic disk unit to the end face of the connector 101 is not specified. Then, according to variations of the size, when the tray 104 reaches to the mechanical stopper, connection between the connector 101 and the connector 103 becomes faulty because engagement between the connectors is too shallow. On the other hand, because the engagement may be too deep according to variations of the size, there is a fear of warping the back panel.

Furthermore, in the mounting mechanism of the magnetic disk unit as shown in FIG. 33A, by inserting the magnetic disk unit 100 to the end of the frame 105, the back panel 102 is warped. A warp of the back panel is generated according to the force required to connect the connector 101 of the magnetic disk unit 100 and the connector 103 of the back panel 102 and the strength of the back panel 102. When the back panel 102 warps, connection or engagement of the connector 101 of the magnetic disk unit 100 and the connector 103 of the back panel 102 shallows. That is, a gap may occur between the connector 101 and the connector 103.

When a gap occurs between the connector 101 and the connector 103 (the length of a gap is assumed to be m in FIG. 33A), as shown in FIG. 33A, the length from the left end face of the magnetic disk unit 100 to the right end face of the back panel 102 is L+gap m (when the connector 101 and the connector 103 are coupled with no gap, a length from the left end face of the magnetic disk unit 100 to the right end face of the back panel 102 is assumed to be L). Under this condition, when the tray carrying the magnetic disk unit 100 (not shown in FIG. 33A) is returned toward the front of the frame in the opposite direction of insertion, the warp of the back panel can be released. However, when the length from the left end face of the magnetic disk unit to the right end face of the back panel 102 is nearly 3.45+0.7 inch, the back panel 102 has a probability of contacting the frame 105 as shown in FIGS. 33B and 33C. In this case, the stress remains between the back panel 102 and the frame 105. As a result, the back panel 102 may be supported by the frame 105.

Problem 4

In the SCA specification, two different sizes, which have a difference of about 0.7 mm, are allowed as a size from the bottom face of the magnetic disk unit to the center of the connector. The value of 0.7 mm exceeds the above described positioning error alignment ability (+−0.5 mm). Accordingly, two types of magnetic disk units, whose sizes from the bottom side to the center of the connector are different, cannot be mounted by the same mounting mechanism. Therefore, a mounting mechanism corresponding to each unit is required. This means that these two types of magnetic disk units cannot exist in the same product. As a result, when one type of magnetic disk unit stops being used in production, and the other type of magnetic disk unit is selected for use, a problem occurs of having to change the design of the mounting mechanism.

For instance, as shown in FIG. 34, the connector 103 of the back panel 102 is arranged to make the center of the connector 103 situated at the center of two different connector positions of the connector a and the connector b, wherein the positions in the Z dimension are different. The positioning error between each of the centers of the connector a and the connector b of the magnetic disk unit 100 and the center of the connector 103 of the back panel 102 is +—0.35 mm respectively and the positioning error of +—0.35 mm is within the range of the positioning error alignment ability of +—0.5 mm.

However, the positioning error alignment ability for the positioning error of the connector in the Z dimension is (+—0.5 mm)—(+—0.35 mm)=+—0.15 mm, by subtracting the +—0.35 mm. Variation of the position of the connector in the Z dimension allowed by the SCA specification is +—0.5 mm. As a result, since the variation of +—0.5 mm is larger than the +—0.15 mm, there is a case where the magnetic disk unit cannot be connected when inserted into the mounting mechanism, even though the magnetic disk unit matches the specification, because the positioning error of the connector on the back panel is too large.

Problem 5

There is also a case where the magnetic disk unit is not mounted to all the back panels. Hence, according to the direction of cooling air wind, there may occur collecting dusts in the connector of the back panel which cause the bad connection.

SUMMARY OF THE INVENTION

The present invention solves these problems. It is an object of the present invention to make it possible to eliminate the stress when the connector is connected in such a way that the stress is added to the connector and the board.

It is a further object of the present invention to have a structure which will not support the magnetic disk unit by using a connector.

It is a further object of the present invention to reduce the inferiority for mounting components based on the fact that a tolerance in the Y dimension is not specified by the SCA specification Revision 3.0.

It is a further object of the present invention to enable the magnetic disk unit to be mounted in either position when two sorts of positions, of the connector in the Z dimension, are allowed for the magnetic disk unit.

Furthermore, it is a further object of the present invention not to accumulate dust in the connector.

Furthermore, it is another object of the present invention not to contact the back panel on the frame, and not to support the back panel by the frame, even though there is a gap between connectors.

Furthermore, it is another object of the present invention not to generate a warp in the back panel. According to one aspect of the present invention, A mounting mechanism of components according to a first connector and a second connector may include:

(a) a first component having the first connector and a guide pin with a thick body and a thin body;

(b) a second component having the second connector to be connected with the first connector and a guide part to guide the guide pin for leading the first connector to the second connector; and, (c) a frame for mounting the first and second components.

According to another aspect of the present invention,

A mounting mechanism of components according to a first connector and a second connector may include:

(a) a first component having the first connector;

(b) a second component having the second connector to be connected with the first connector;

(c) a frame
for mounting the second component under a condition that the second component has a fixed amount of moving range at least in the direction of connecting and in the direction of disconnecting the first connector from the second connector,
for mounting and moving the first component to the second component in the direction of connecting the first connector to the second connector up to a limitation of the moving range of the second component so as to connect the first connector to the second connector,
for moving the first and the second components less than the fixed amount of moving range in the direction of disconnecting the first connector, and
for fixing the first component.

According to another aspect of the present invention,

A mounting mechanism of a unit may include a magnetic disk unit having a connector in accordance with a SCA specification, a tray for carrying the magnetic disk unit, a frame having at least than one shelf for installing the tray, a back panel mounted on the frame with a connector to connect the connector of the magnetic disk unit, the back panel being mounted to be able to move back and forth, left and right and up and down at a fixed amount, wherein the back panel has a guide hole, and the guide pin mounted on the tray to fit into the guide hole, wherein the guide pin has a step shaped body.

According to another aspect of the present invention,

A mounting mechanism of a unit may include the magnetic disk unit having a connector in accordance with a SCA specification, a tray for carrying the magnetic disk unit, a frame having at least one shelf for installing the tray; and a back panel mounted on the frame with a connector to connect the connector of the magnetic disk unit, the back panel being mounted to be able to move back and forth, left and right, and up and down at a fixed mount, wherein the tray is installed and pushed to an end of the shelf, is returned by a predetermined length from the end of the shelf toward a front of the shelf, and fixed to the frame.

According to another aspect of the present invention,

A mounting mechanism of a unit may include a tray for mounting and carrying the unit in accordance with a SCA specification, and a frame having at least one shelf for installing the tray,
wherein the tray mounts the unit by changing a mounting height for mounting the unit so as to select one of two heights of the connector positions specified in the SCA specification.

According to another aspect of the present invention,

A method for mounting a first component into a frame by connecting a first connector of the first component and a second connector of a second component mounted on a rear of the frame, may include the steps of:

(a) matching positions of the first connector of the first component and the second connector of the second component according to a guide pin mounted on the first component and a guide hole mounted on the second component;

(b) connecting the first connector and the second connector under the condition that the positions of the first and the second connectors is matched according to the guide pin mounted on the first component and the guide hole mounted on the second component;

(c) releasing the matching of the positions according to the guide pin mounted on the first component and the guide hole mounted on the second component after connecting the first connector and the second connector.

According to another aspect of the present invention,

A method for mounting a first component into a frame by connecting a first connector of the first component and a second connector of a second component mounted on a rear of the frame having a movable range of backward and forward may include the steps of:

(a) moving the first component to the rear of the frame and connecting the first connector of the first component to the second connector of the second component;

(b) moving the first component forward within the movable range of the second component;

(c) fixing the first component on the frame.

The present invention seeks to provide a mounting mechanism for mounting components securely in place within a frame. The component to be mounted has pins with enlarged heads which can be accepted into holes on the back panel of the frame. The enlarged heads provide a precise guiding mechanism to ensure the direct connection of connectors of the frame and the component. After the connectors couple, the pins tapered inner body provides for slight movement of the back panel of the frame to allow for proper seating and adjustment of the connectors as further insertion is completed.

The present invention also provides for a notch in the frame which receives a rotatable cam which is connected to the component to be mounted. As the cam rotates and is received in the notch, the cam forces the component to the rear of the frame and the pins at the rear of the component seat the connectors. As the rotating cam reaches the end of its fully turned position, and the connectors are fully engaged with each other, the cam bevel received in the notch of the frame recedes a bit so as to slightly retract the component from the frame. In another embodiment of the present invention, a spring mechanism is used to return the component slightly in the opposite direction of insertion. These features of the present invention allow pressure on the back panel from the component to be relieved and ensure that the connectors do not support the weight of the component.

Other aspects of the present invention include a dust cover to keep dust from entering the connector areas of the frame and component, and a stopper to allow proper placement of an electronic device such as a disk drive within the component mounted in the frame. The dust cover automatically disengages covering of the connector of the component or the frame upon insertion of the component into the frame. A support for stresses on the back panel of the frame is provided for as well. Finally, mounting holes on the component chassis are provided for varying sizes of electronic devices.

Other objects features, and advantages of the invention will be apparent from the following description when taken in conjunction with the accompanying drawings.

BRIEF DESCRIPTION OF THE DRAWINGS

In the drawings,

FIG. 7 shows a flow chart of the procedure for a method for mounting components;

FIG. 14A shows two sorts of positions for mounting, the magnetic disk unit on the tray;

FIG. 14B shows two sorts of positions for mounting the magnetic disk unit on the tray;

FIG. 14C shows two sorts of positions for mounting the magnetic disk unit on the tray;

FIG. 19 shows a back panel providing the connector cover;

DESCRIPTION OF THE PREFERRED EMBODIMENTS

Embodiment 1.

In this embodiment, the mechanism for mounting components, where a magnetic disk unit in accordance with the SCA specification is mounted on a tray and the tray is mounted on the frame, will be described. The tray provides the guide pin which has a thick body and a thin body. The back panel provides a guide hole for guiding the guide pins. The back panel is characterized by being mounted on the frame under the condition that it can move at a fixed amount up and down, right and left, and back and forth.

Figure 1:
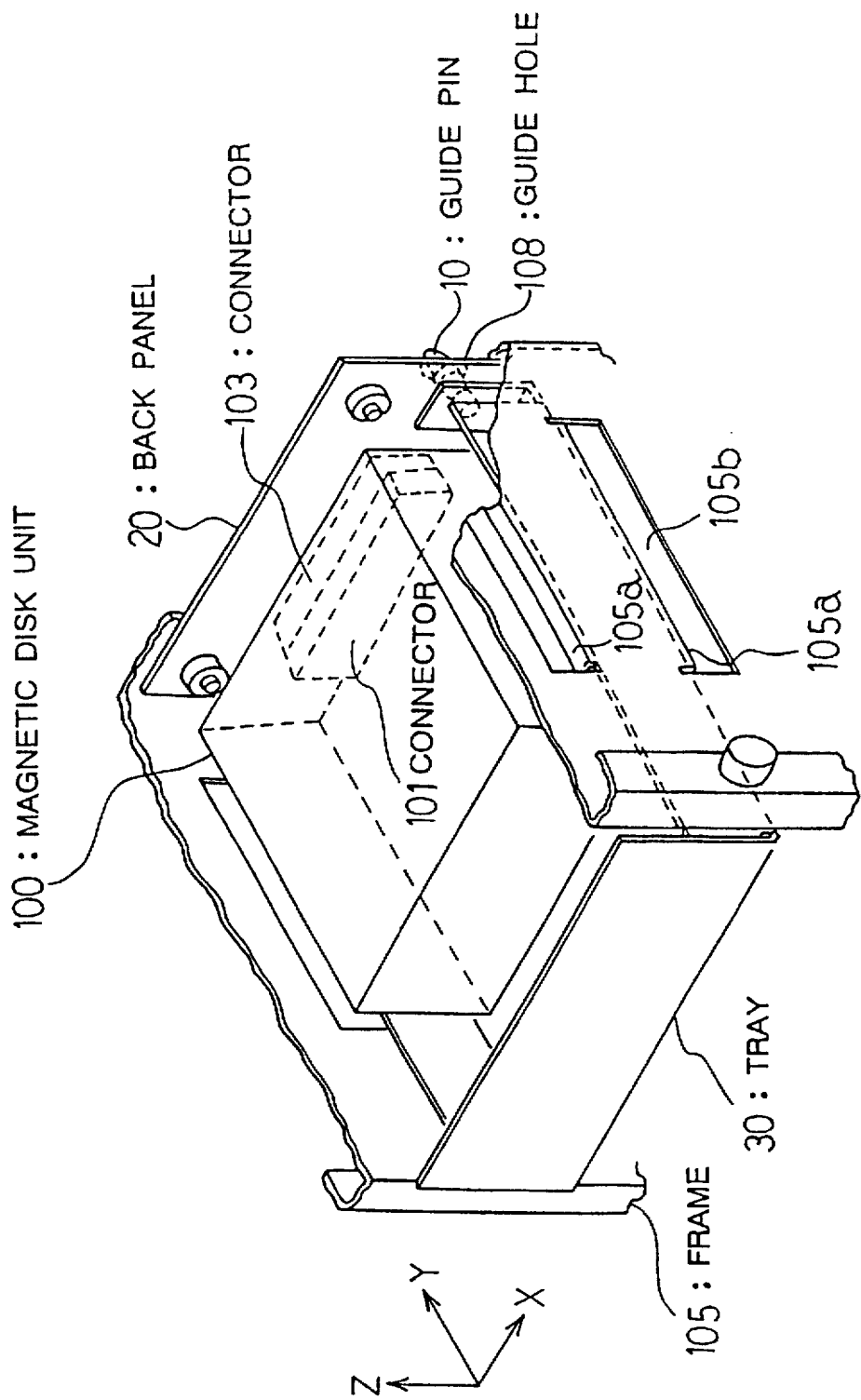
FIG. 1 shows a mechanism for mounting components according to this invention.

FIG. 1 depicts the mechanism for mounting components according to this invention. In FIG. 1, a tray 30 provides a guide pin 10. The frame 105 has a frame window 105b on the side face, formed by cutting the side face. The side face cut for forming the window is bent inside and thus a support 105a of the tray is formed. The inside of the frame 105 has a back panel 20 which is movable up and down, right and left, and back and forth. The back panel 20 provides a guide hole 108 for guiding the guide pin 10. A magnetic disk unit 100 carried on the tray 30 is installed on the frame 105 by inserting the tray 30 into the frame 105. The guide pin 10 is guided by the guide hole 108 of the back panel 20. Then, according to the guiding action of the guide hole 108, the connector 101 of the magnetic disk unit 100 is connected with the connector 103 of the back panel 20. In FIG. 1, the insertion direction for the frame 105 of the tray 30 is assumed to be Y. As shown in FIG. 1, the vertical direction of up and down in relation to the insertion direction Y is assumed to be Z. Furthermore, the direct direction of right and left in relation to the insertion direction Y is assumed to be X.

Figure 2A:
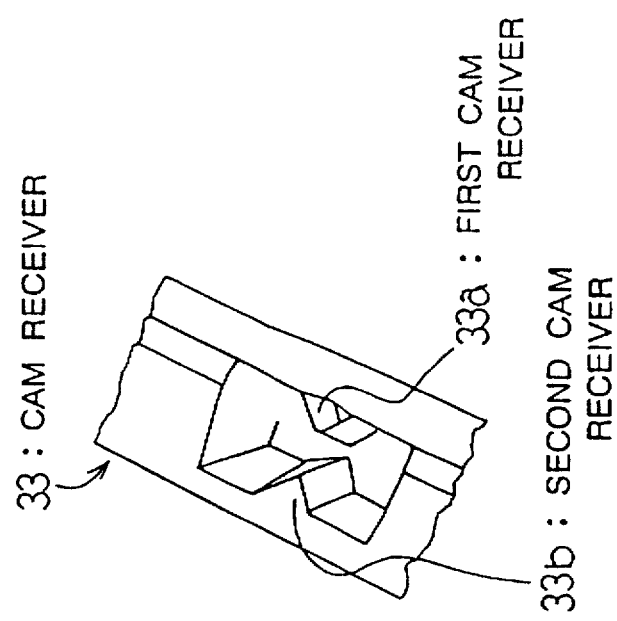
FIG. 2 shows that a frame has a plurality of shelves.
Figure 2:
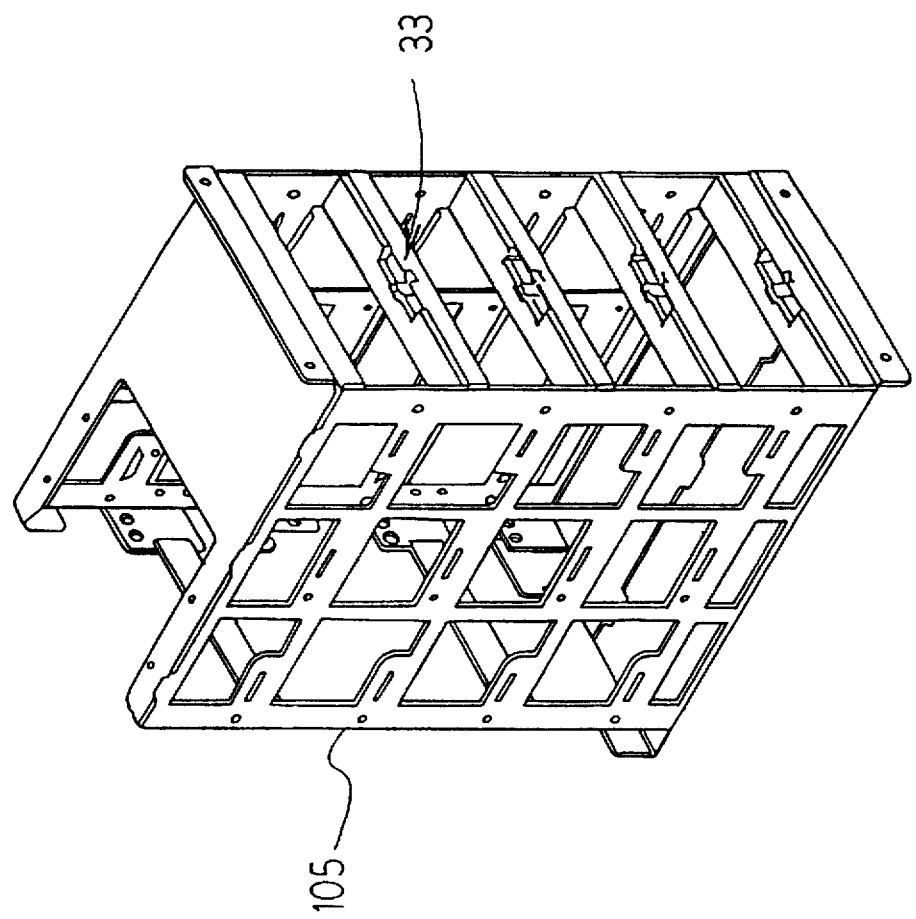

FIG. 2 shows a view for explaining that the frame has a plurality of shelves. The frame 105 shown in FIG. 2 configures one frame by stacking four shelves lengthwise. Each shelf has a cam receiver 33. The cam receiver 33 helps the tray 30 to be inserted easily to the frame 105. Furthermore, when the tray 30 is inserted to the end of the frame 105, the cam receiver 33 helps the tray 30 to move in the removal direction in the Y dimension. The cam receiver 33 comprises the first cam receiver 33a and the second cam receiver 33b. An interval between the first cam receiver 33a and the second cam receiver 33b is 2.8 mm. The operation of the cam receiver 33 will be described later.

Figure 3A:
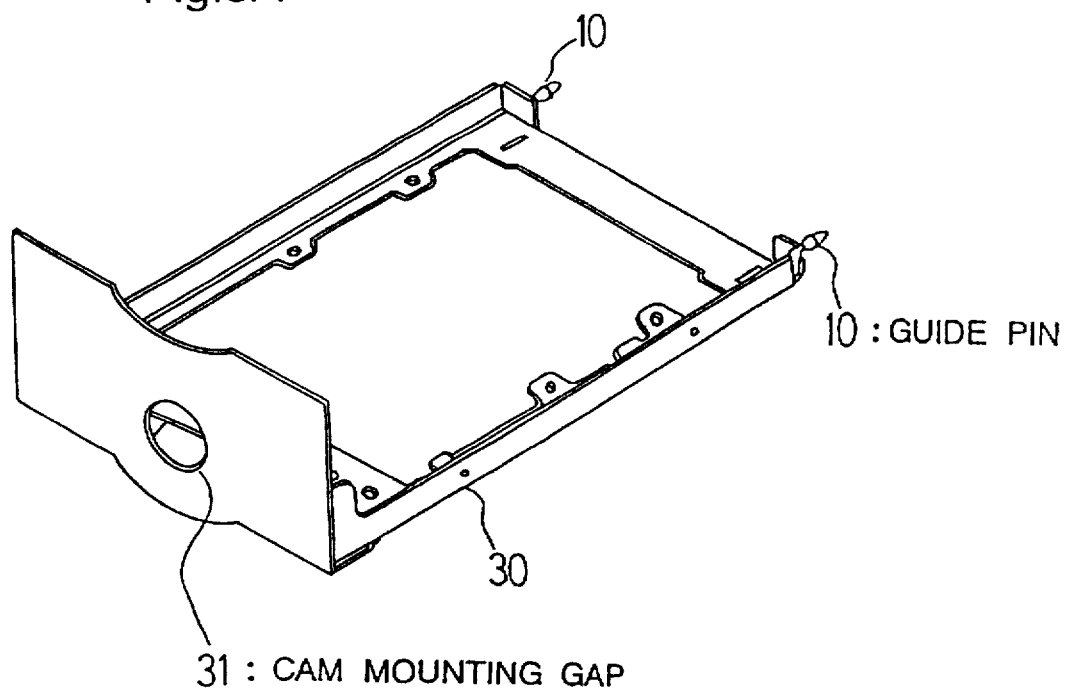
FIG. 3A shows a formation of a tray.
Figure 3B:
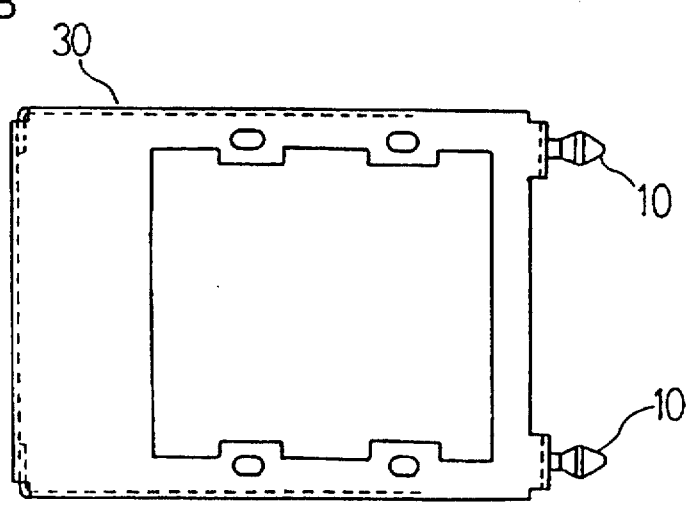
FIG. 3B shows another formation of the tray.

FIGS. 3A and 3B show a shape of the tray in FIG. 1. FIG. 3A shows a perspective view of the tray 30. FIG. 3B shows a bottom face view of the tray 30. As shown in FIG. 3A, the tray 30 provides a cam mounting gap 31 for mounting a cam. The tray 30 provides two guide pins 10.

Detailed description of the shape of the guide pins 10 will be described in FIG. 4.

Figure 4:
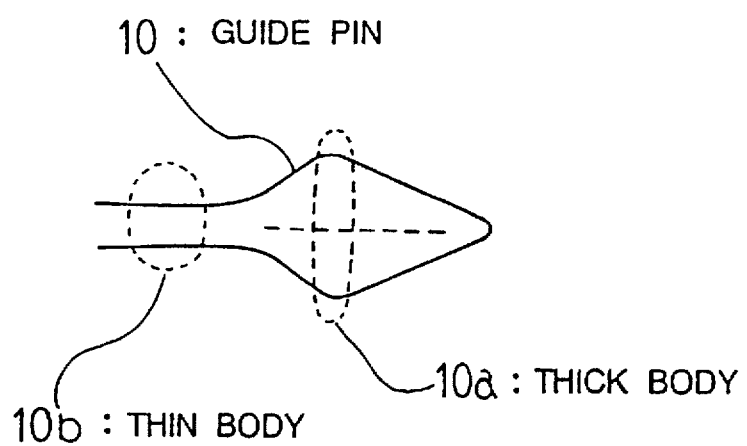
FIG. 4 shows an example of a shape of a guide pin.

FIG. 4 shows an example of a shape of a guide pin.

The guide pin 10 has a thick body 10a and a thin body 10b. A slanting portion of the top of the guide pin 10 to the thick body 10a has an angle of about 30 degrees, for instance, from the center axis of the guide pin 10. When the guide pin 10 is inserted into the guide hole 108, the thick body 10a is guided into the guide hole 108 first from the top of the guide pin 10. At this point, the position setting of the connector 101 of the magnetic disk unit 100 and the connector 103 of the back panel 20 is performed. When the guide pin 10 is being inserted into the guide hole 108, the thin body 10b of the guide pin 10 passes the guide hole 108. Then, the position setting of the connectors by the guide pin 10 and the guide hole 108 is released. A detailed procedure of the method for mounting components according to this invention will be described later in FIG. 7.

Figure 5A:
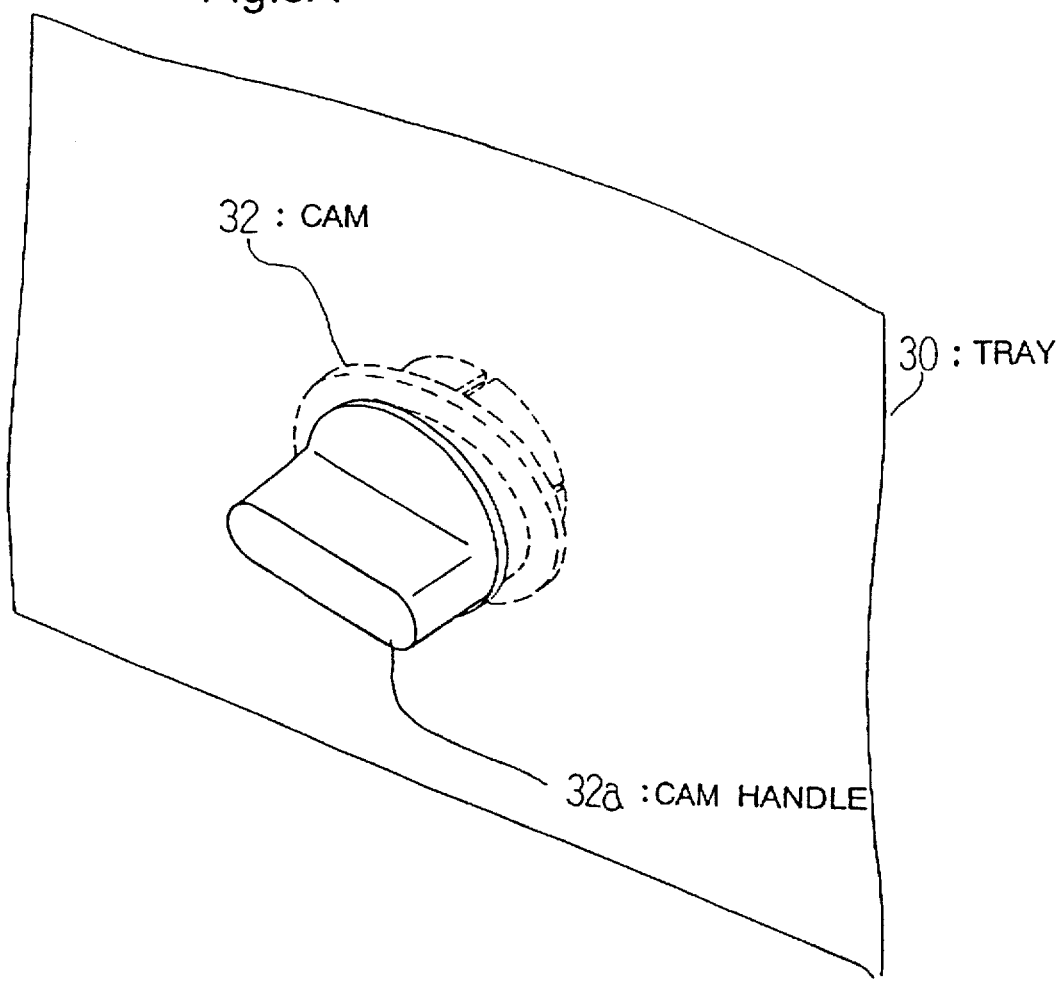
FIG. 5A shows a view of a cam and a cam handle.
Figure 5B:
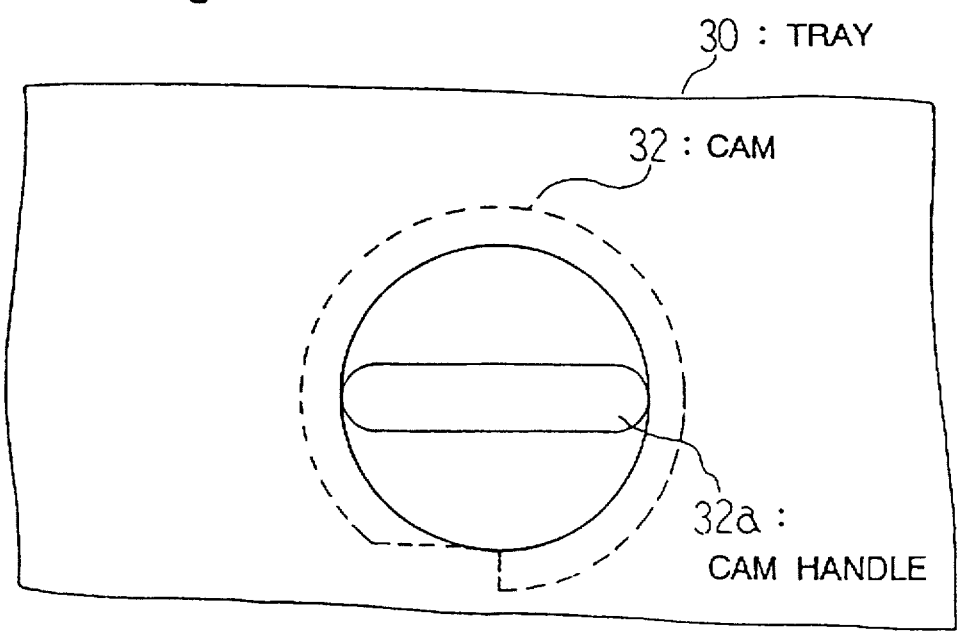
FIG. 5B shows another view of the cam and the cam handle.

FIGS. 5A and 5B depict a shape of cam. FIG. 5A shows a perspective view from the direction of a cam handle. FIG. 5B shows a front view from the direction of a cam handle. The cam 32 has a cam handle 32a. The cam 32 is mounted through a cam mounting gap 31 in order to extend out the cam handle 32a from the outside of the tray 30. When the tray 30 is inserted to the frame 105, the user secures and connects the tray by turning the cam handle 32a clockwise. When the tray 30 is pulled out from the frame 105, the user turns the cam handle 32a counter-clockwise.

Figure 6A:
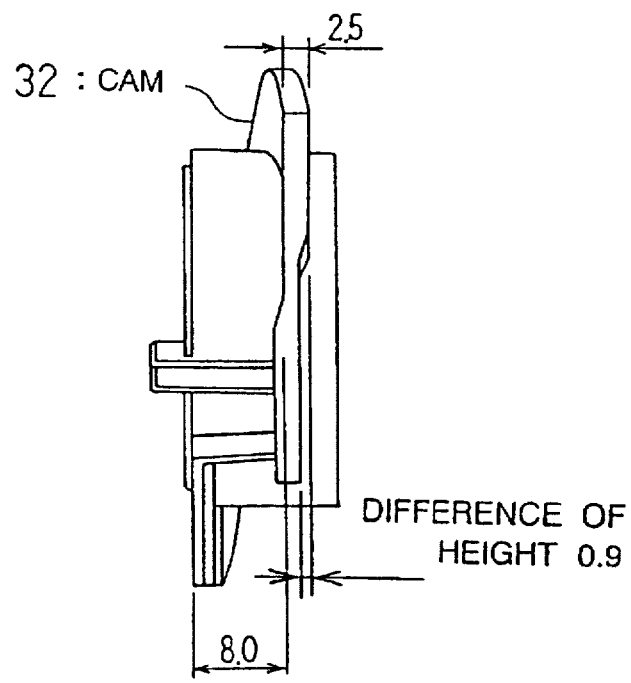
FIG. 6A shows a shape of the cam.
Figure 6B:
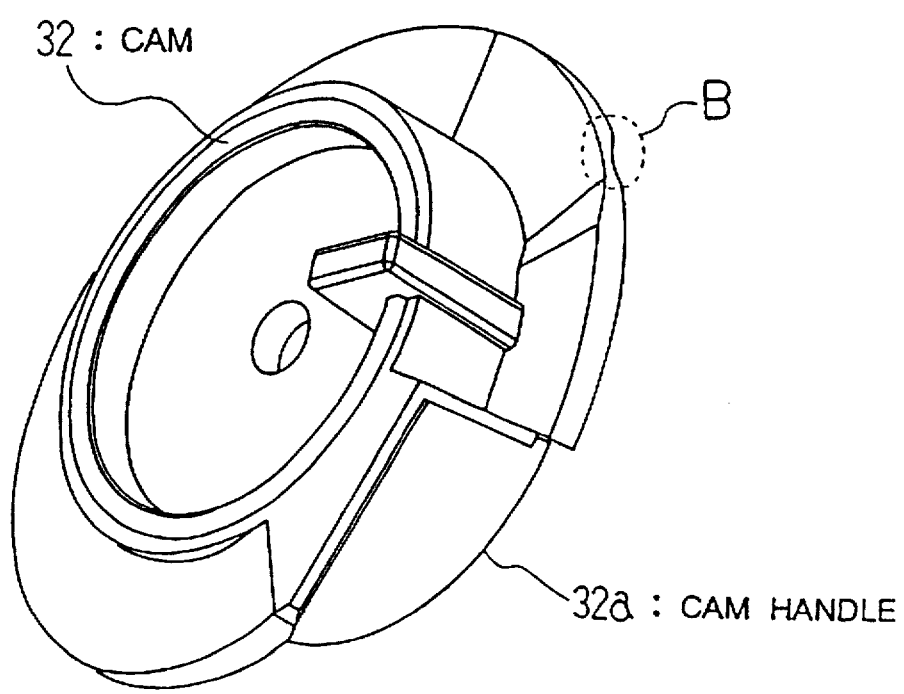
FIG. 6B shows another shape of the cam.

FIGS. 6A and 6B show a shape of cam. FIG. 6A shows a side face view of the cam. FIG. 6B shows a perspective view of the cam. As shown in FIG. 6A, the cam has a difference of height at an end of the spiral shape. B surrounded by a doted line of FIG. 6B shows the difference of height. The terminate position of the cam has the difference of height. In this embodiment, the difference of height is assumed to be 0.9 mm. The thickness of the cam is 2.5 mm and the depth is 8.0 mm.

FIG. 7 shows a flow-chart for explaining the procedure for a method of mounting components. The method of mounting components as shown in. FIG. 7 will be described later.

Figure 8A:
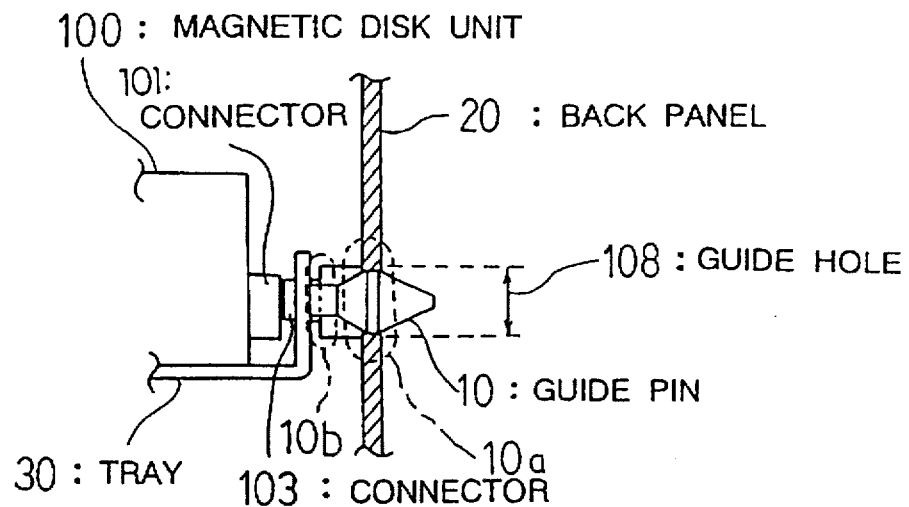
FIG. 8A shows the operation for inserting the guide pin into the guide hole.
Figure 8B:
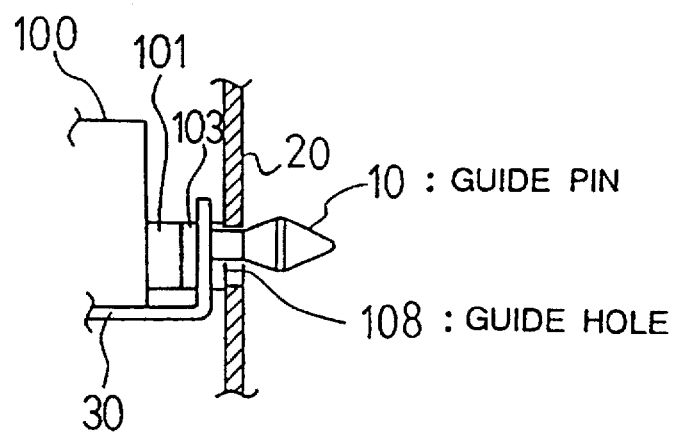
FIG. 8B shows another operation for inserting the guide pin into the guide hole.

FIGS. 8A and 8B show the operation of inserting the guide pin into the guide hole.

FIG. 8A shows a condition wherein the guide hole 108 guides the thick body 10a of the guide pin 10. When the guide hole 108 guides the thick body 10a, the connector 101 of the magnetic disk unit 100 and the connector 103 of the back panel 20 perform position matching. FIG. 8B shows a view in which the thin body 10b of the guide pin 10 passes the guide hole 108. When the thin body 10b of the guide pin 10 passes the guide hole 108, a gap occurs between the guide pin 10 and the guide hole 108. At this point, stress to the connector 101 and the connector 103 which are connected together is released.

FIGS. 9A to 9E show a relationship between a cam and a cam receiver when the tray is being inserted to the frame.

Figure 9A:
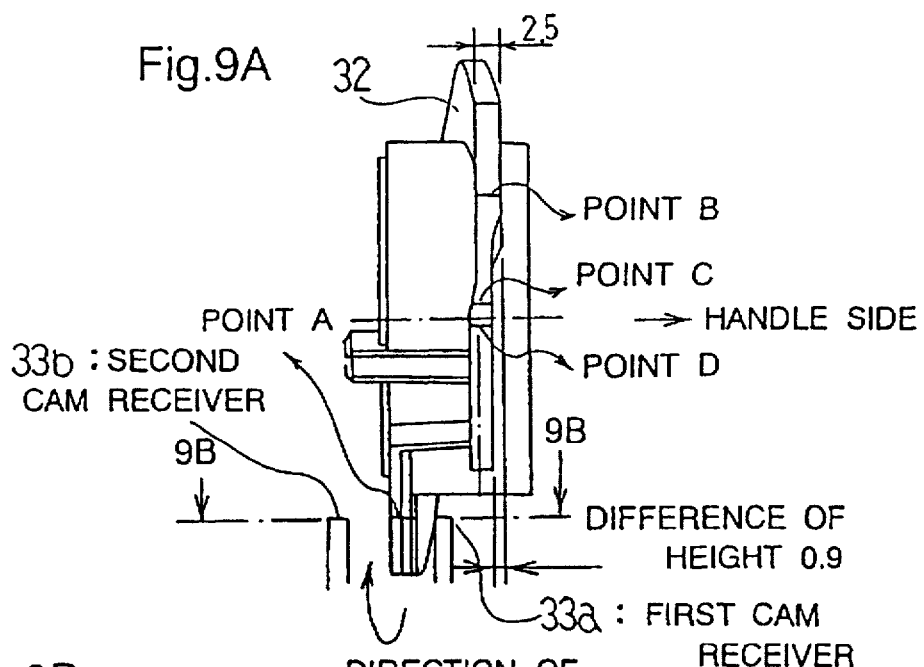
FIG. 9A shows a relationship of the cam receiver at the time of inserting the tray into the frame.

FIG. 9A shows a relationship between the cam 32 and the cam receiver 33 which is turned 30 degrees in a clockwise direction while inserting the tray 30 to the frame 105. According to FIG. 9A, the cam handle 32a for turning the cam 32 is positioned on the right side of the figure. Further, the direction of turning the cam 32 is the same direction a clock hand moves. In FIGS. 9B to 9E, a relationship is shown among the cam 32 at points A, B, C, and D in FIG. 9A, the first cam receiver 33a, and the second cam receiver 33b. FIGS. 9B to 9E show an X—X cross sectional view of FIG. 9A.

Figure 9B:
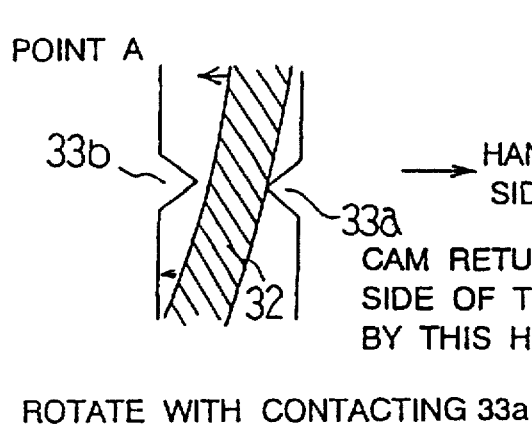
FIG. 9B shows a relationship of the cam receiver at the time of inserting the tray into the frame.

At the beginning, a relationship is shown between the cam 32 at point A and the cam receiver 33 with reference to FIG. 9B.

FIG. 9B shows a condition in which the tray 30 is inserted into the frame 105 and the cam 32 rotates a little. The cam 32, directly after the tray 30 is inserted to the frame 105, contacts the first cam receiver 33a. By rotating the cam handle 32a clockwise, the tray 30 is inserted to the frame 105.

Figure 9C:
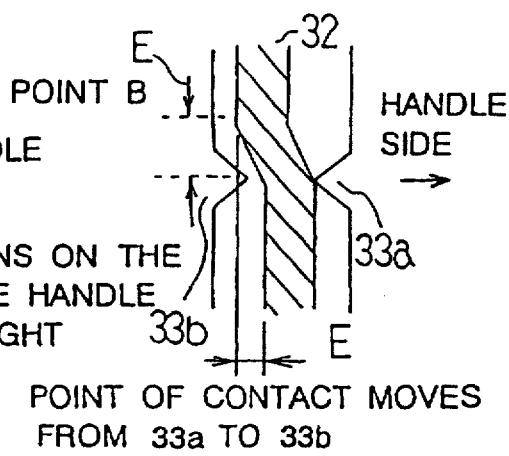
FIG. 9C shows a relationship of the cam receiver at the time of inserting the tray into the frame.
Figure 9D:
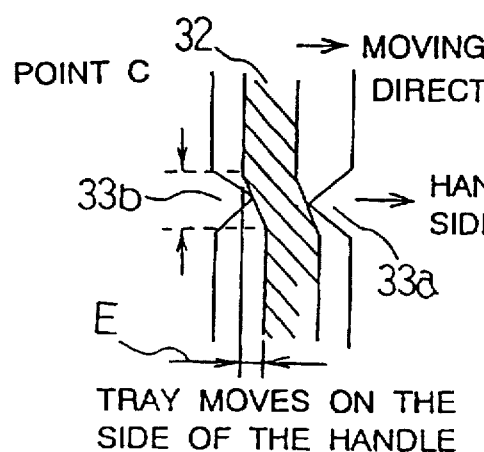
FIG. 9D shows a relationship of the cam receiver at the time of inserting the tray into the frame.

FIG. 9C shows a relationship between the cam 32 and the cam receiver 33 at point B. At point B, the status is shown just before a difference of height provided at the termination portion of the cam 32 contacts the second cam receiver 33b. At point B, movement in the opposite direction against the side of the handle of the cam 32 stops. Furthermore, when the tray 30 is being inserted into the frame 105, the cam 32 passes point C and reaches point D. When passing point B, the cam 32 comes into contact with the second cam receiver 33b instead of the first cam receiver 33a. With this change of the contact, the tray 30 returns in the opposite direction of the moving direction. FIG. 9D shows a relationship between the cam 32 and the cam receiver 33 at point C. Point C shows a center of the difference of height provided at the termination point of the cam 32. At point C, the cam 32 contacts the second cam receiver 33b and the moving direction of the tray 30 is in the direction of the side of the handle. The movement of the tray 30 in the direction towards the side of the handle is controlled according to the difference of height provided at the termination point of the cam 32.

Figure 9E:
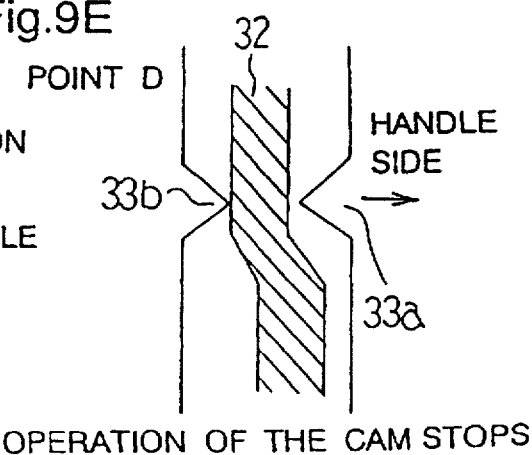
FIG. 9E shows a relationship of the cam receiver at the time of inserting the tray into the frame.

FIG. 9E shows a relationship between the cam 32 and the cam receiver 33 at point D. Point D shows the status directly after the tray 30 passes the difference of height provided at the termination point of the cam 32.

Just before the tray 30 reaches point D, the tray 30 moves in the direction of the side of the handle, but the movement of the tray 30 stops when it passes the difference of height at the termination point of the cam 32.

Furthermore, before reaching point B, the connector 101 and the connector 103 are connected. However, the back panel 20 is under the floating condition moving back and forth. Therefore, during to the rotation of the cam 32, when the tray 30 moves in the opposite direction of the insertion direction, the connection of the connector 101 and the connector 103 is not loosened or released.

When the tray 30 is being pushed into the end of the frame 105, the back panel 20 mounted inside of the frame 105 is movable up and down, right and left, and back and forth and is in a condition to be pushed to the frame 105. However, because of a difference of height of the cam 32, the tray 30 returns in the opposite direction of the insertion direction of the frame 105. Then, a gap occurs between the back panel 20 and the frame 105.

Due to the gap, the tray 30 is supported by the tray supporter 105a of the frame 105, the cam 32 and the cam receiver 33. This follows the regulation that mechanical support as determined by the SCA specification, is performed by the other components besides the connector.

The procedure of mounting components according to this invention will be described with reference to a flow-chart of FIG. 7.

Before the procedure is started, the back panel 20 is mounted on the frame 105 in advance. The back panel 20 is mounted in a floating condition so that it can float up and down, right and left and back and forth in relation to the frame 105. Then, the components begin to be mounted in accordance with the procedure as shown in FIG. 7. The tray 30 carried in the magnetic disk unit 100 is inserted into the frame 105 and the tray 30 is moved towards the backward of the frame 105. The connection of the frame 105 to the tray 30 is performed by rotating the cam handle 32a clockwise. When the tray 30 is being inserted, the guide pin 10 is inserted into the guide hole 108. The thick body 10a of the guide pin 10 is guided by the guide hole 108. Based on this, the position setting between the connectors 101 and 103 is performed at S2.

Next, the step for connecting the connectors 101 and 103, in which the position setting is performed, will be performed at S3. After connecting the connectors 101 and 103, the tray 30 is further inserted into the frame 105. Then, the thin body 10b of the guide pin 10 passes the guide hole 108. Here, the position setting of the connectors 101 and 103, set by the thick body 10a of the guide pin 10 and the guide hole 108, performed at S2, is released at S4. These procedures are carried out by rotating the cam handle 32a. By rotating the cam handle 32a clockwise, the tray 30 is inserted into the frame 105, and the difference of height mounted at the end of the cam 32 contacts the cam receiver 33b and the tray 30 returns in the opposite direction of the insertion direction at S5. Based on the difference of height provided at the end of the cam 32, the tray 30 returns in the opposite direction of the insertion direction. Then the cam 32 does not rotate by contacting the second cam receiver 33b and the tray 30 is locked to the frame 105. This locking means the tray 30 is fixed on the frame 105 at S6.

The difference of height provided at the termination point of the cam 32 is 0.9 mm. But, this does not mean that the tray returns up to 0.9 mm. The thickness of the cam 32 is 2.5 mm and the gap of the cam receiver 33 is 2.8 mm. Therefore, the difference of 0.3 mm is a loss of the amount of movement and actually the tray 30 returns by about 0.6 mm. The back panel can move back and forth at least this distance and therefore, when the tray 30 returns in the opposite direction of the insertion direction by about 0.6 mm, the back panel moves in the opposite direction with the tray. As a result, the connection of the connectors 101 and 103 is not released.

Figure 31A:
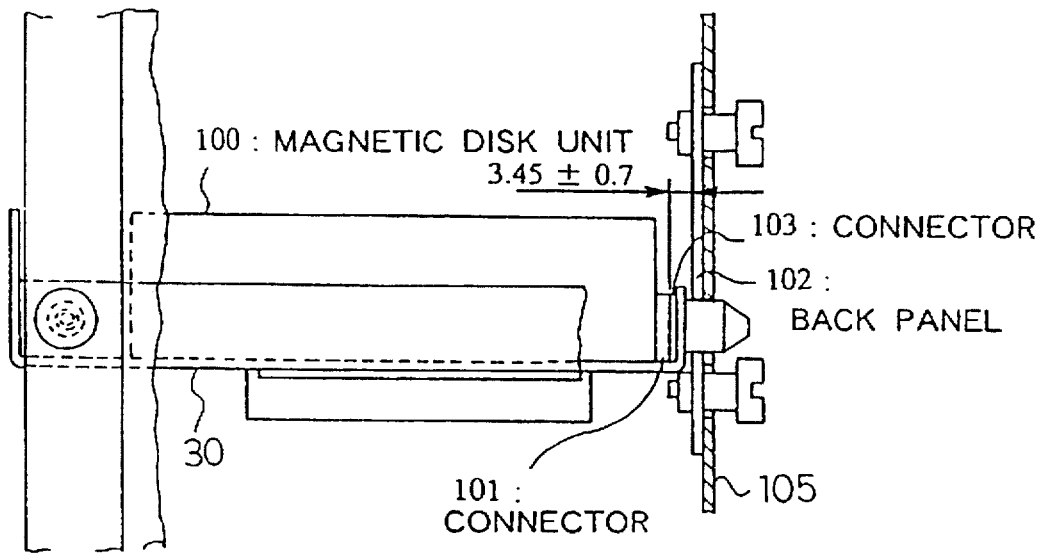
FIG. 31A shows a tolerance allowed in the SCA specification when the connector of the magnetic disk unit and the connector of the back panel are combined.
Figure 31B:
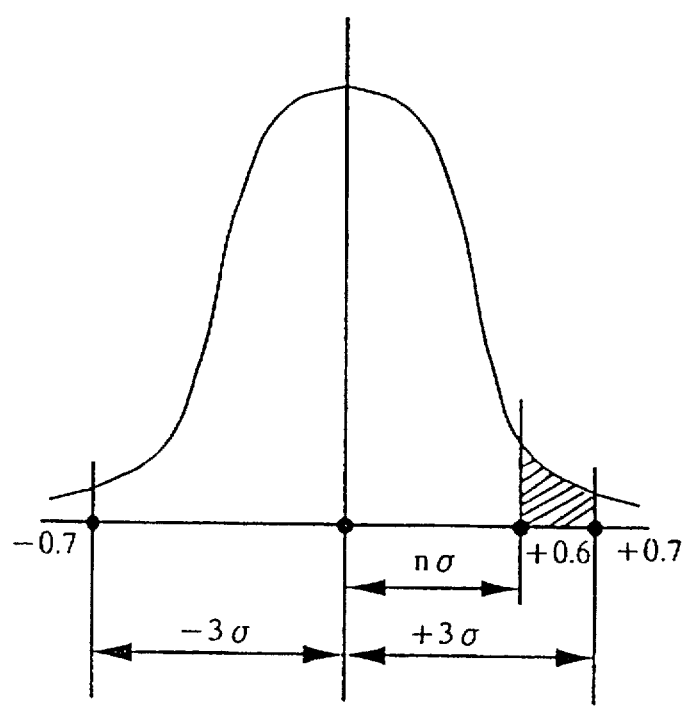
FIG. 31B shows that a variation of industrial products is distributed normally.

As shown in FIG. 31A and described in the related art, when the connector 101 of the magnetic disk unit 100 and the connector 103 of the back panel 102 are connected, a tolerance of +−0.7 mm is set as a size from the right end of the connector 101 to the left face of the back panel 102. A variation of the size of the industrial product is generally in accordance with a normal distribution. As shown in FIG. 31B, when a tolerance of +−0.7 mm is a variation of the product, a width of 3σ is distributed normally (As described in the related art, generally the industrial product is distributed within a range of +−3σ in a normal distribution table). Therefore, the probability in which a size from the right end face of the connector 101 of the magnetic disk unit 100 to the left face of the back panel 102 is more than 0.6 mm is calculated as follows. First, when a probability distributed within a range of nσ in FIG. 31B is calculated, 3×0.6/0.7= 2.571. Further, with reference to a standard normal distribution table based on the value of 2.571, the probability is 0.4949. Therefore, a probability of more than 0.6 mm (probability distributing in the portion slanted in FIG. 31B) is 0.5% in accordance with the equation, 1−(0.5+0.4949)= 0.0051. Therefore, by returning the tray 30 in the opposite direction of insertion by 0.6 mm, it is possible to avoid a condition where the back panel 102 contacts the frame 105 at a rate of 99.5%.

Figure 10A:
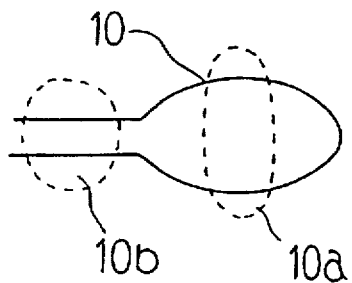
FIG. 10A shows a shape of a guide pin.
Figure 10B:
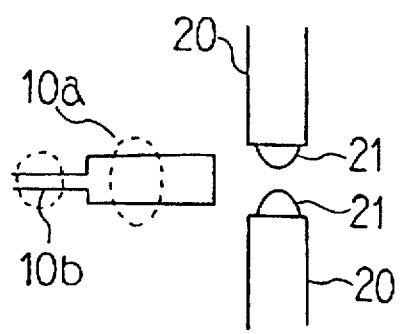
FIG. 10B shows another shape of a guide pin.
Figure 10C:
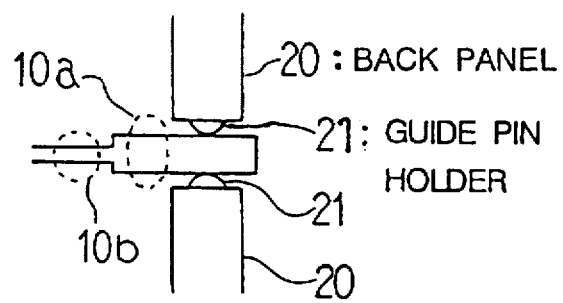
FIG. 10C shows another shape of a guide pin.

The shape of the guide pin described above is as shown in FIG. 4. As long as the guide pin has the thick body and the thin body, the shape of the guide pin as shown in FIGS. 10A to 10D is also acceptable. FIG. 10A shows a globe shaped top of the pin. The center of the globe shape has a thick body 10a. In FIGS. 10 and 10C, the guide pin whose top is square-shaped is shown. The square portion has a thick body 10a. In order to guide the guide pin, the guide pin holder 21 is provided on the side of the back panel 20. Two of the guide pin holders 21 exist and the guide pin 10 is held between the two. The distance between the two guide pin holders 21 is provided in the back panel 20 and is narrower than the width of the thin body 10a of the guide pin 10. The guide pin holder 21 is made of an elastic member.

Figure 10D:
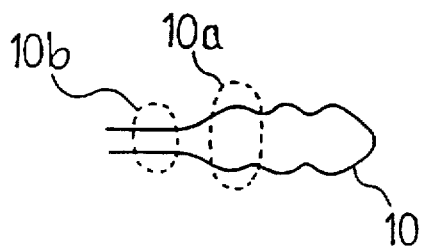
FIG. 10D shows another shape of a guide pin.

As shown in FIG. 10C, when the guide pin 10 is inserted into the back panel 20, the guide pin holder 21 is pushed by the guide pin 10 and the guide pin holder 21 guides the guide pin 10 by the elastic force. Further, when the guide pin 10 is inserted into the back panel 20, a thin body 10b of the guide pin 10 passes the guide pin holder 21. The guide pin holder 21 releases the position setting of the connectors 101 and 103 when the thick body 10a of the guide pin 10 passes beyond the guide pin holder 21. FIG. 10D shows a guide pin whose top of the body head is a wave-shaped. The portion of a high wave is the thick body of the guide pin 10.

A mechanism for mounting components and a mechanism for mounting units and a method for mounting components in Embodiment 1 have the following characteristics.

In the mechanism for mounting components according to the present invention, a guide pin having a thick portion and a thin portion is provided. When the connector is connected, the thick portion gives with a high precision for positioning. When the connection of the connector completes, the thin-portion releases the stress of the connector.

Furthermore, the back panels are mounted so that they may move at least up and down and right and left. Namely, when the back panel is mounted to the frame under this floating condition, the positioning error of the connector is corrected by moving the back panel up and down, right and left.

By mounting the back panel on the frame so as to be movable at least back and forth, and then pushing the connector once and drawing it back thereafter, the connection of the connector is emphasized.

By returning the tray slightly, once pushed into the frame, in the opposite direction of insertion by 0.6 mm, 99.5% of the time the back panel and frame contact is avoided and the back panel does not support the magnetic disk unit.

Furthermore, the tray is pushed to the back panel by the cam and the cam receiver, and then the tray is separated from the frame with the back panel.

Though not shown in the figure, it is appreciated that the connector 101 and the guide pin 10 are formed as one component such as a molded part. The position setting of the connectors is emphasized.

Though not shown in the figure, it is appreciated that the connector 103 and the guide hole 108 are formed in one component such as a molded part. The positional precision of the connector 103 and the guide hole 108 is emphasized.

By configuring the connector 101 and the guide pin 10 as one component, it is possible to reduce the mounting error which may occur between the connector 101 and the guide pin 10 and to arrange the connector 101 and the guide pin 10 more correctly.

By configuring the connector 103 and the guide hole 108 as one component, it is possible to reduce the mounting error which may occur between the connector 103 and the guide hole 108 and to arrange the connector 103 and the guide hole 108 more correctly.

Embodiment 2.

In Embodiment 1, by using the cam and the cam receiver, the tray carrying the magnetic disk unit returns in the opposite direction of insertion. However, by pushing either of the tray, the back panel or the combination of the tray and the back panel by using a spring, it is possible to return the tray and the back panel in the opposite direction of the insertion direction of the tray.

Figure 11:
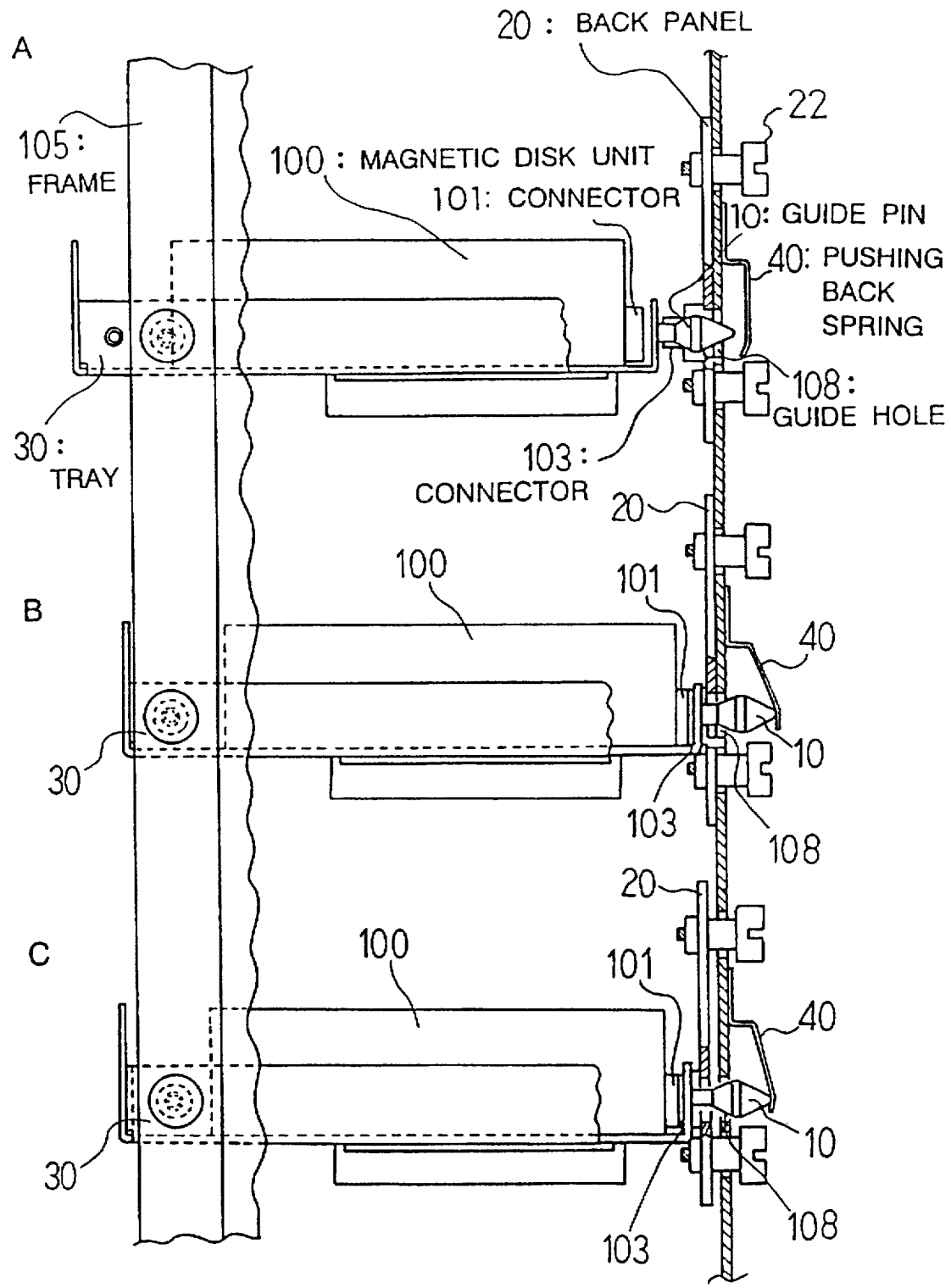
FIG. 11 shows an example of returning the tray in the opposite direction of insertion by using a spring.

FIG. 11 shows an example of returning the tray in the opposite direction to the insertion direction of the tray.

In FIG. 11, the frame 105 provides a pushing back spring 40 for contacting the guide pin 10 and for pushing the tray back in the opposite direction of insertion.

Figure 12:
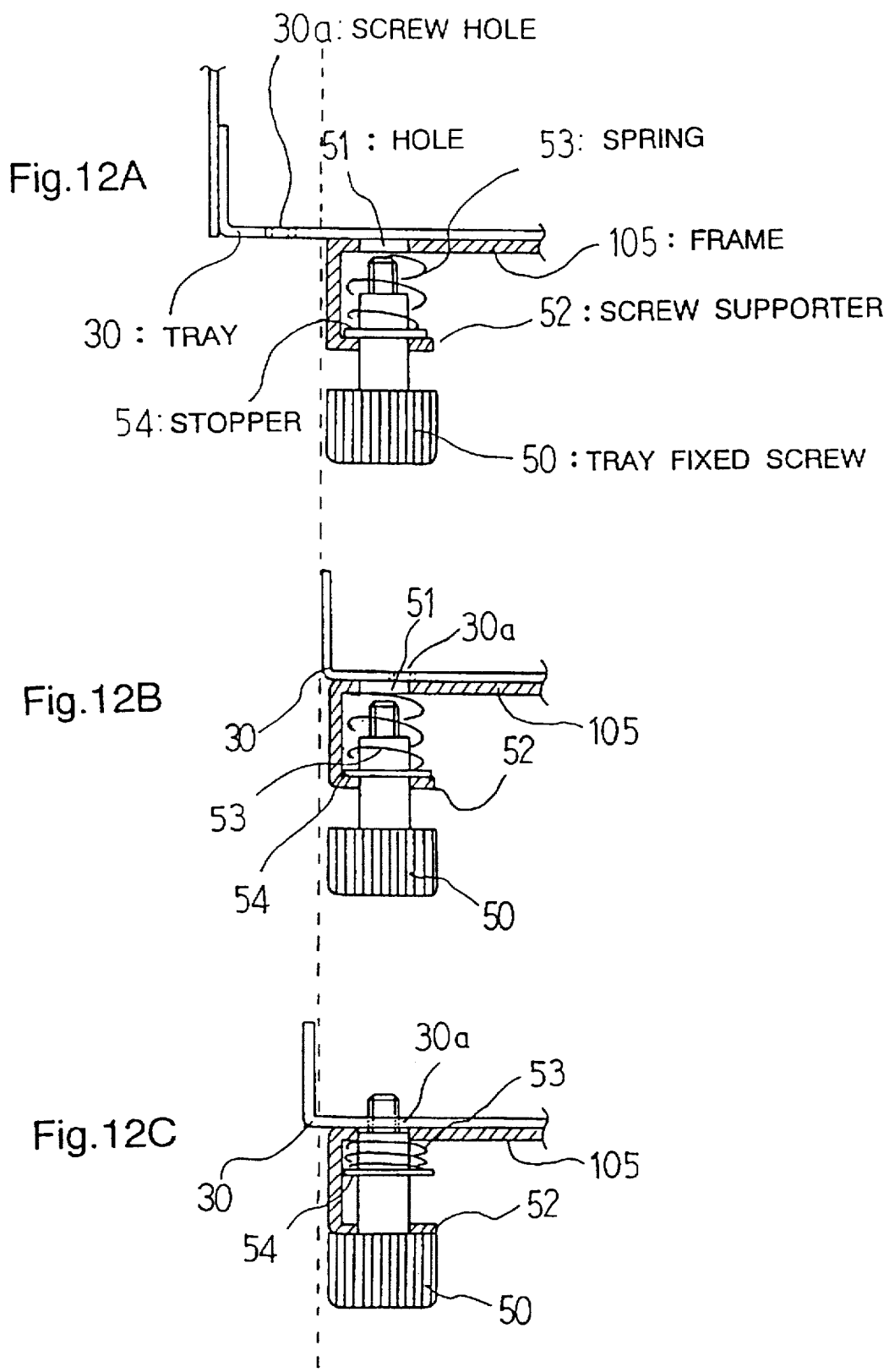
FIG. 12A shows a method for fixing the tray on the frame.
FIG. 12B shows a method for fixing the tray on the frame.
FIG. 12C shows a method for fixing the tray on the frame.

FIGS. 12A and 12C show a method for fixing the tray on the frame.

Hereinafter, according to the procedure as shown in FIG. 7, the mounting procedure in this embodiment will be explained. In A of FIG. 11, the tray 30 carrying the magnetic disk unit 100 is moved into the frame 105 and the tray is inserted (S2, S3, S4). When the tray 30 is inserted to the end of the frame 105, as shown in B of FIG. 11, the guide pin 10 pushes up the pushing back spring 40. When the tray is pushed to the end of the frame 105, and the force of the pushing is loosened, the tray 30 is pushed back in the opposite direction of insertion according to the force of the pushing back spring 40 at S5. The back panel 20 is pushed back with the tray 30 by the pushing back spring 40. The above condition is shown in C of FIG. 11. Furthermore, the pushed back tray 30 is fixed on the frame 105 by using a tray fixing screw 50 at S6. The tray 30 is fixed by using the tray fixing screw 50 as shown in FIGS. 12A to 12C. In order to mount the tray fixing screw 50, as shown in FIG. 12A, a screw supporter 52 is provided in advance on the side face. Furthermore, the side face of the frame 105 has a hole 51 for passing the screw. The tray fixing screw 50 is pressed on the side of the screw supporter 52 by the spring 53 and the stopper 54. When the tray 30 is inserted into the frame 105, the tray fixing screw 50 is situated so as not to disturb insertion of the tray 30 by the spring 53. As shown in C of FIG. 11, where the tray 30 is pushed back in the opposite direction of insertion by the pushing back spring 40, the user tightens the tray fixing screw 50 at the point where the screw hole 30a of the tray and the hole 51 of the frame overlap and fixes the tray 30 to the frame 105.

Figure 13:
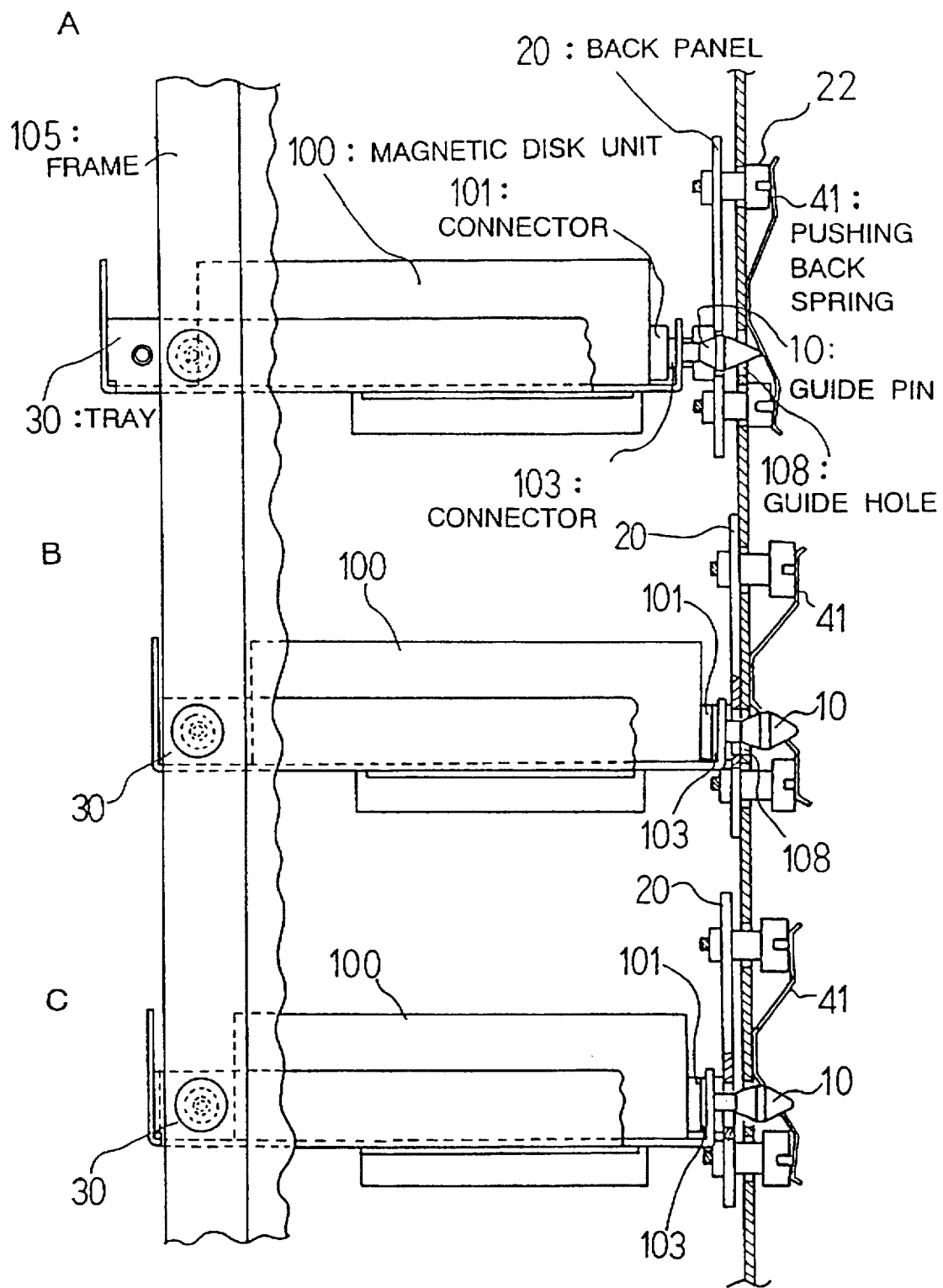
FIG. 13 shows an example of returning the tray in the opposite direction of insertion by using a spring.

As another method for pushing back the tray 30 and the back panel 20, uses the pushing back spring 14 shown in FIG. 13. The pushing back spring 41 is connected to the frame 105 by the fixing tool not shown in the figure.

In FIG. 11, the one end of the pushing back spring 40 is fixed on the frame 105 and the other end of the pushing back spring 40 contacts the guide pin 10. Then, the pushing back spring 40 pushes back the guide pin 10 and the combination of the back panel 20 and the tray 30 is pushed back. However, as shown in the shape of the pushing back spring of FIG. 13, the back panel 20 can be pushed back by using the pushing back spring 41. As shown in FIG. 13, the center part of the pushing back spring 41 is fixed on the frame 105 and both ends of the pushing back spring 41 contact screws 22 which are connected to the frame 105. When the contractors 101 and 103 are not connected, the pushing back spring 41 presses the screw 22, and a gap occurs between the back panel 20 and the frame 105 (See A of FIG. 13). When the tray 30 is inserted to the end of the frame 105 and the thick body of the guide pin 10 passes the guide hole 108 and the connectors 101 and 103 are connected, the back panel 20 goes against the force of the pushing back spring 41 and contacts the frame 105 (See B of FIG. 13). Then, by the force of the pushing back spring 41, the back panel 20 is pushed back. In accordance with the force for pushing back the back panel 20, the tray 30 is pushed back slightly in the opposite direction of insertion (See C of FIG. 13).

After the tray 30 is pushed back, the tray 30 and the frame 105 are fixed with the tray fixing screw 50 as shown in FIGS. 12A to 12B.

As has been described, in Embodiment 2, the tray carrying the magnetic disk unit is pushed back by using the elastic member.

In Embodiment 2, the back panel is mounted to be movable at least back and forth and the connector is drawn back after pushed in once. Therefore, the connection of the connector is emphasized.

By returning the tray once pushed in, in the opposite direction of insertion by 0.6 mm, 99.5% of the time the back panel and the frame contact is avoided and the back panel does not support the magnetic disk unit.

Embodiment 3.

In Embodiment 3, two different sizes (about 0.7 mm) are allowed for the distance from the bottom side of the magnetic disk units to the center of the connector. These distances are in the SCA specification described in the Related Art.

FIGS. 14A to 14C show the two kinds of mounting positions in a case where the magnetic disk unit is mounted on the tray.

FIG. 14A shows that the side of the tray 30 has a tray screw hole 35a having a long diameter for fixing the magnetic disk unit 100 on the side face of the tray 30 and a tray screw hole 35b. The tray screw hole 35a and the tray screw hole 35b have the same size. They are screw holes having a long circler dimension in Z direction and have two centers at point A and point B. The length between the centers point A and point B of the screw hole is 0.7 mm. There exist two types of magnetic disk units defined by the SCA specification. As shown in FIG. 14B, it is assumed that the height from the bottom face of one type of magnetic disk unit 100 to the center of the connector 101 is c. As shown in FIG. 14C, it is assumed that the height from the bottom face of the other type of magnetic disk unit 100 to the center of the connector 101 is d. Namely, d−c=0.7 mm. When each of the two types of magnetic disk units 100 is mounted on the tray 30, each height from the bottom face of the tray 30 to the center of the connector 101 of the mounted magnetic disk unit 100 is set in a fixed position (for example, 6 mm). In the magnetic disk unit 100, having a height c from the bottom face of the magnetic disk unit 100 to the center of the connector 101, as shown in FIG. 14B, the screw 36a is inserted at point A of the tray screw hole 35a. Then, the screw 36b is inserted at point A of the tray screw hole 35b and the magnetic disk unit 100 is fixed on the tray 30. In the magnetic disk unit 100, having a height d from the bottom face of the magnetic disk unit 100 to the center of the connector 101, as shown in FIG. 14C, the screw 36a is inserted at point B of the tray screw hole 35a. Then, the screw 36b is inserted at point B of the tray screw hole 35b and the magnetic disk unit 100 is fixed on the tray 30.

By returning the tray once pushed in, in the opposite direction of insertion by 0.6 mm, 99.5% of the time the back panel and the frame contact is avoided and the back panel does not support the magnetic disk unit.

As has been described, in the mechanism for mounting units, when the unit is carried on the tray, by changing the mounting position of units, it is possible to mount units to the same back panel having connectors of varying heights, as defined by the SCA specification. Furthermore, by using the screw hole shaped in a long circle on the side wall of the tray, it is possible to mount the magnetic disk unit by shifting it 0.7 mm which covers the two kinds of height defined by the SCA specification. Therefore, no adjustment is required for mounting the magnetic disk unit to the tray corresponding to the two variations of the SCA specification. That is, the magnetic disk unit can be fixed to the tray by being pushed toward either of points A or B.

Embodiment 4.

In Embodiment 4, the mechanism for position setting of the tray and the connector cover mounted on the tray will be explained.

Figure 15A:
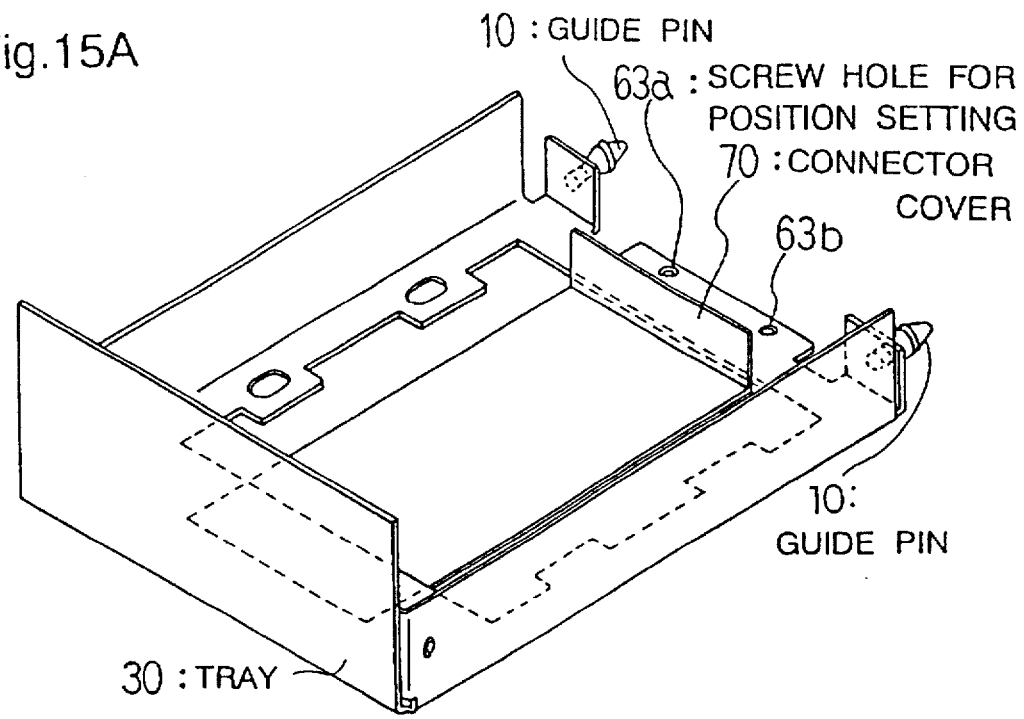
FIG. 15A shows a tray providing a connector cover and a screw hole for position setting.
Figure 15B:
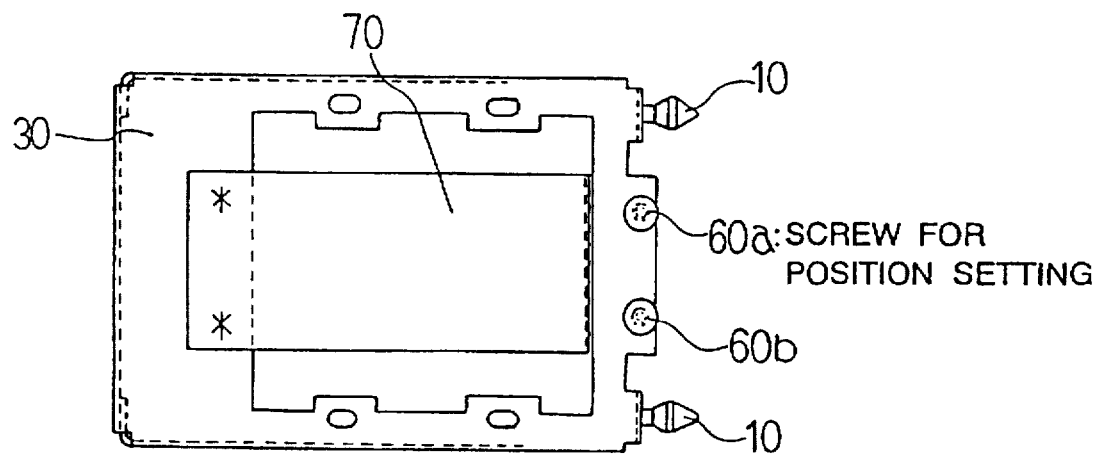
FIG. 15B shows the tray providing the connector cover and the screw hole for position setting.
Figure 15C:
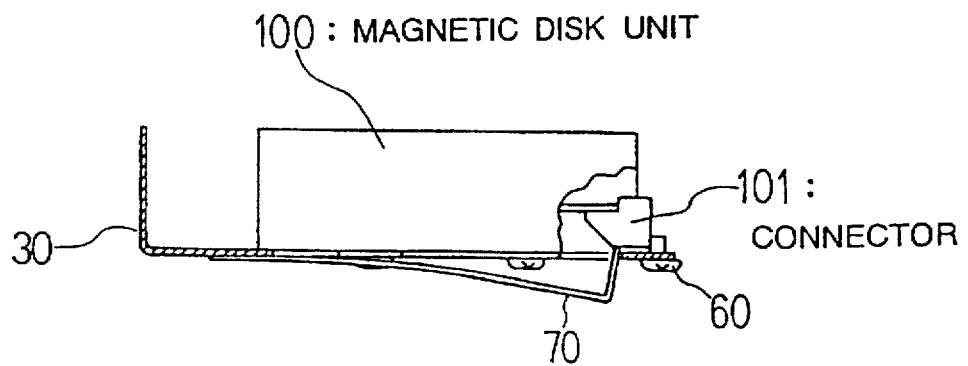
FIG. 15C shows the tray providing the connector cover and the screw hole for position setting.

FIGS. 15A to 15C show the tray having the connector cover and the screw hole for the position setting. FIG. 15A is a perspective view of the tray 30. The tray 30 has screw holes 63a and 63b for setting the position of the tray at the end of the insertion of the tray 30. Furthermore, the tray 30 provides the connector cover 70 composed of the elastic substance like a plate spring. When the magnetic disk unit is not mounted, the tray 30 is inserted into the frame without the magnetic disk unit and the opening part of the connector 103 of the back panel 20 is covered by the connector cover 70. Furthermore, the screw holes 63a and 63b are for position setting of inserting each of the screws 60a and 60b, a mechanism for position setting of the magnetic disk unit on the tray, which shows the mounting position when the magnetic disk unit 100 is mounted on the tray 30 is provided. FIG. 15B shows the bottom face view of the tray 30. One end of the connector cover 70 is fixed to the tray 30. The screws 60a and 60b for position setting are respectively mounted to the screw holes 63a and 63b so that the head of the screw is under the tray 30 and the top of the screw above the tray 30. Furthermore, as shown in FIG. 15C, when the magnetic disk unit 100 is mounted on the tray 30, the top of the connector cover 70 is pushed under the tray by the magnetic disk unit 100. The connector cover 70 is retracted under the tray automatically. The user positions and fixes the magnetic disk unit 100 on the tray 30 such that the magnetic disk unit touches with the top side of the screws 60a and 60b for proper position setting. The screws 60a and 60b for position setting are not required after mounting the magnetic disk unit 100 on the tray 30. Hence, by removing the screws 60a and 60b after position setting, the screws 60a and 60b can be used as screws for mounting the magnetic disk unit 100 on the tray 30.

Figure 16A:
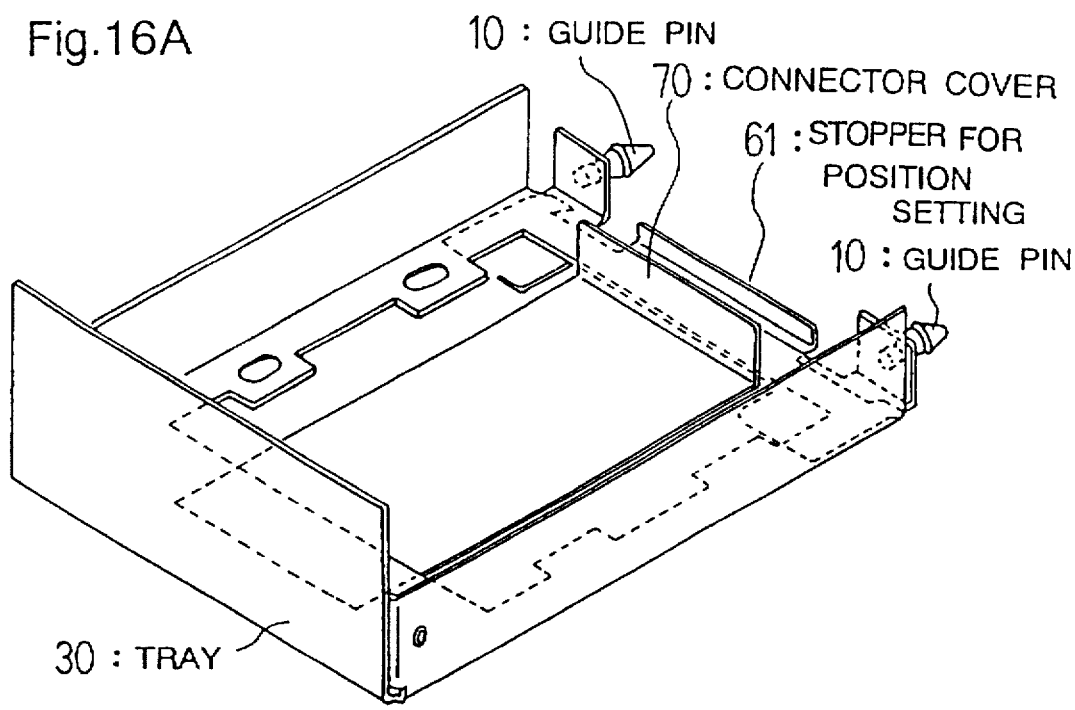
FIG. 16A shows a tray providing a connector cover and a stopper for position setting.
Figure 16B:
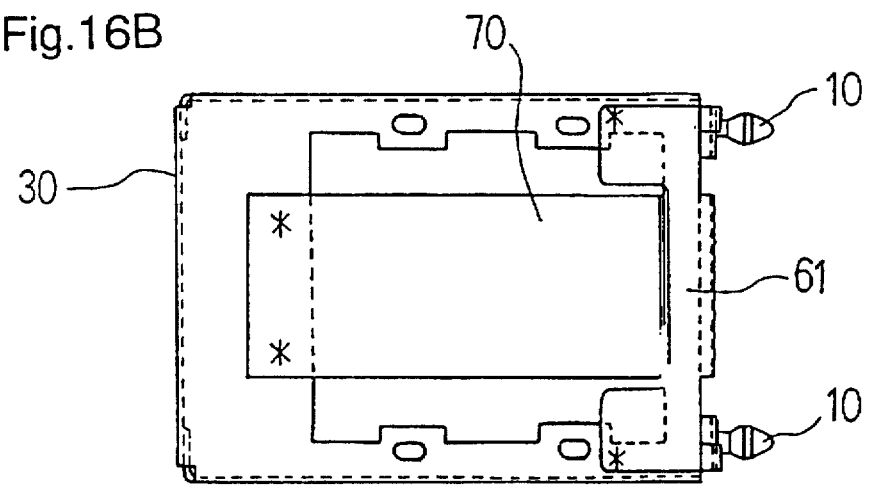
FIG. 16B shows the tray providing the connector cover and the stopper for position setting.
Figure 16C:
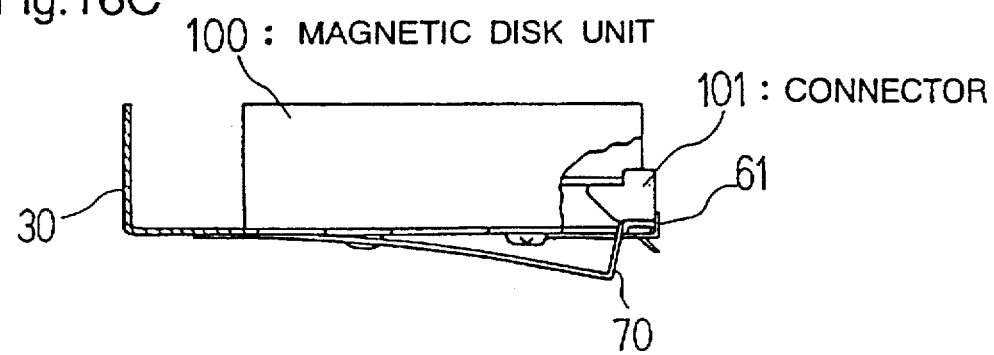
FIG. 16C shows the tray providing the connector cover and the stopper for position setting.

FIGS. 15A to 15C showed screws as the mechanism for setting the position of the magnetic disk unit. This position setting can be performed by using a stopper as shown in FIGS. 16A to 16C. FIGS. 16A to 16C show the tray providing the connector cover 70 and the stopper 61 used for position setting of the magnetic disk unit. The stopper 61 for position setting is made of elastic substance like a plate spring.

As shown in FIG. 16A, the stopper 61 for position setting is provided at the far end of the tray. In addition, as shown in the bottom view of the tray 30 of FIG. 16B, both ends of the stopper 61 for position setting (shown as * in the figure) are fixed on the tray 30. When the stopper 61 for position setting is provided, the connector cover 70 has a mechanism for automatically retracting under the tray when the magnetic disk unit 100 is mounted on the tray 30 as shown in FIGS. 15A to 15C. Furthermore, the stopper 61 for position setting automatically goes under the tray by inserting the tray 30 into the frame 105. This will be explained with reference to FIG. 17.

Figure 17:
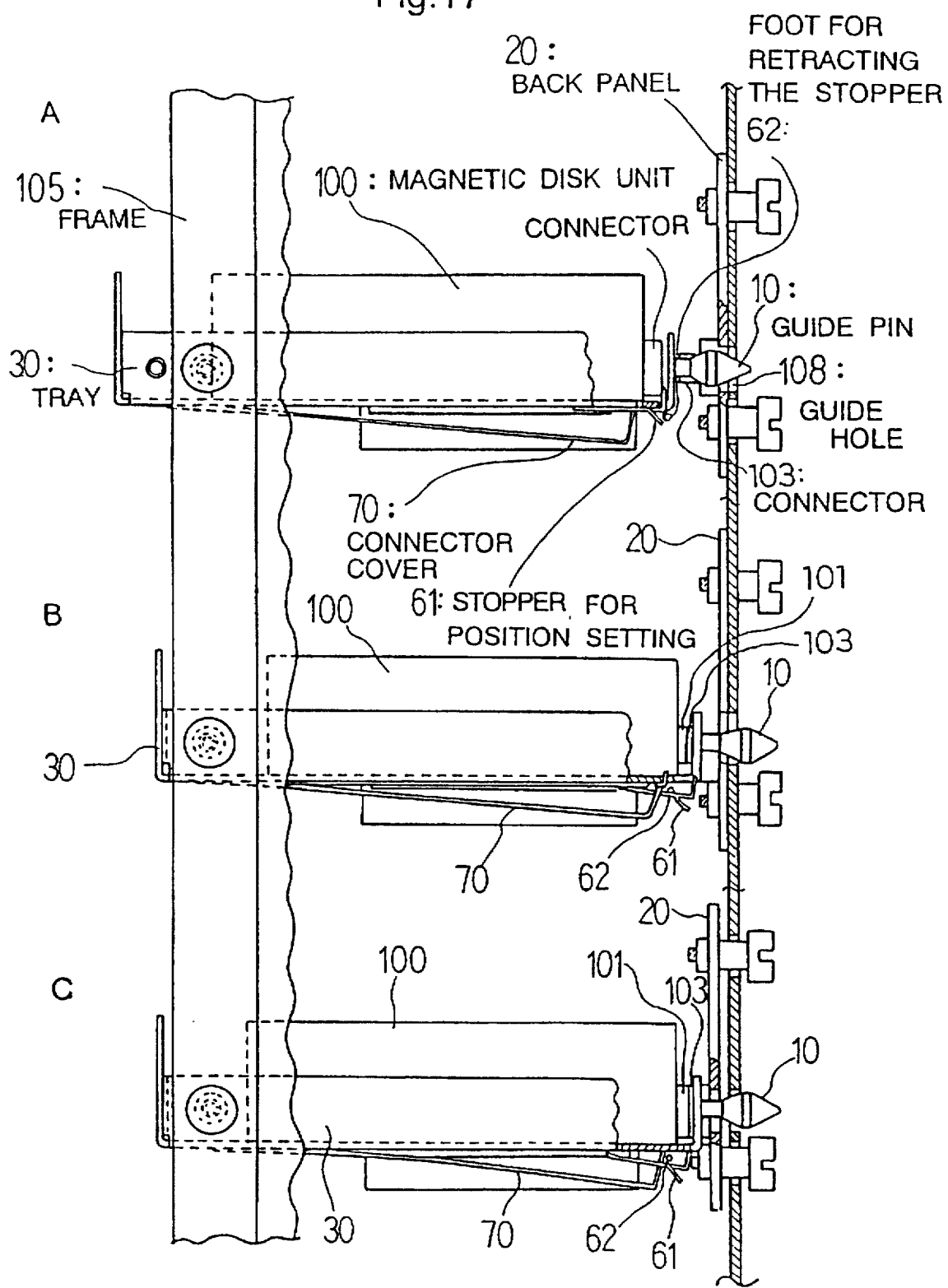
FIG. 17 shows that the stopper for position setting may be avoided.

The frame 105 of FIG. 17 provides a foot 62 for retracting the stopper 61 used for position setting. In A of FIG. 17, the tray 30 is inserted to the frame 105. Hence, the stopper 61 for position setting is still not retracted and contact the lower part of the connector 101. Consequently, when the tray 30 is inserted into the end of the frame 105, as shown B of FIG. 17, the stopper 61 for position setting picks up the foot 62 and during the insertion of the tray 30, the stopper 61 for position setting is retracted by the foot 62. When the tray 30 is inserted to the end of the frame 105, such that the connectors 101 and 103 are connected (in C of FIG. 17), the stopper 61 for position setting is retracted by the foot 62. In this way, a mechanism in which the stopper 61 for position setting cannot go back to the original position is provided.

When the tray 30 is drawn back, the connector cover 70 and the stopper 61 for position setting return to the original condition due to an elastic force.

As has been described, according to embodiment 4, the position of the magnetic disk unit is precisely set for the tray according to the mechanism of position setting. Furthermore, by using the screw mounted on the tray, the position of the magnetic disk unit is set.

In addition to the position of the magnetic disk unit being set on the tray according to the stopper, the stopper is retractably mounted. Hence, the stopper will not disturb the connection of the connector.

By mounting the cover for the connector, the connector gets no dust collected in it. Furthermore, the cover of the connector of the back panel is mounted on the side of the tray. By removing the cover automatically, the cover will not disturb the connection of the connector.

In addition, the cover is retracted during mounting of the magnetic disk unit to the tray. By inserting the tray into the frame, the mechanism for position setting is also retracted. Hence, the cover and the mechanism for position setting will not disturb the connection of the connector.

By providing the mechanism for setting position, it is possible to perform the precise position setting of the magnetic disk unit on the tray being inserted. When there is a variation in size of the magnetic disk unit, it is possible to absorb the variation in size of the magnetic disk unit on top of the tray, according to the mechanism for position setting (the size in this case means a length variation of a magnetic disk unit in the direction of insertion of the magnetic disk unit). Furthermore, the mechanism for position setting can be realized by a simplified configuration such as the screws. In addition, the mechanism for position setting can be realized according to the stopper which is retractable. By covering the connector, it is possible to stop the flow of the cooling air wind and thus dust will not be collected in the connector. Furthermore, since the cover of the connector of the back panel is mounted on the tray, when the magnetic disk unit is not carried, if the tray is inserted in the frame, dust will not be collected in the connector. By inserting the tray to the frame, it is possible to prevent the unused tray from being lost. Furthermore, by retracting the cover when mounting a magnetic disk unit on the tray on the unit, it is possible to prevent disturbing connection of the connector.

Embodiment 5.

In Embodiment 5, the screw hole used for the mechanism for position setting is used as a screw hole for mounting the connector cover. Furthermore, the screw for position setting is used as a screw for fixing the magnetic disk unit on the tray.

Figure 18A:
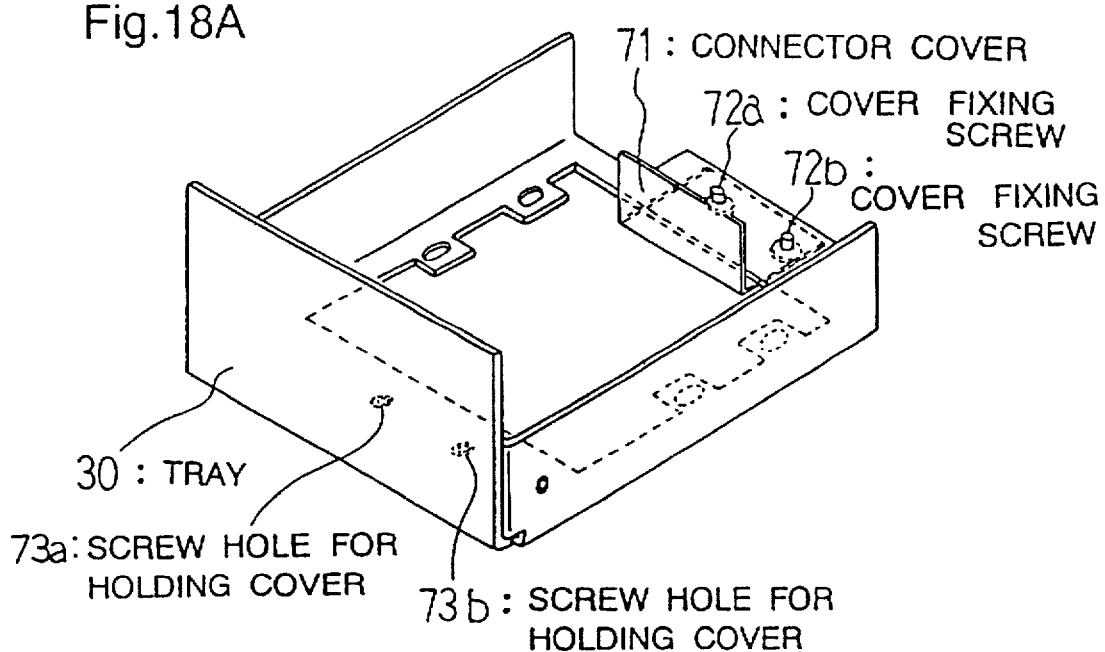
FIG. 18A shows the tray providing the connector cover and the screw hole for position setting.
Figure 18B:
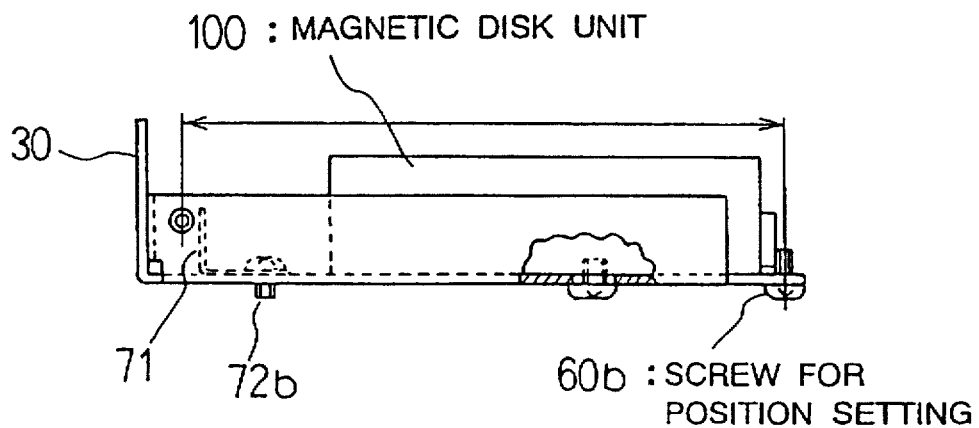
FIG. 18B shows the tray providing the connector cover and the screw hole for position setting.
Figure 18C:
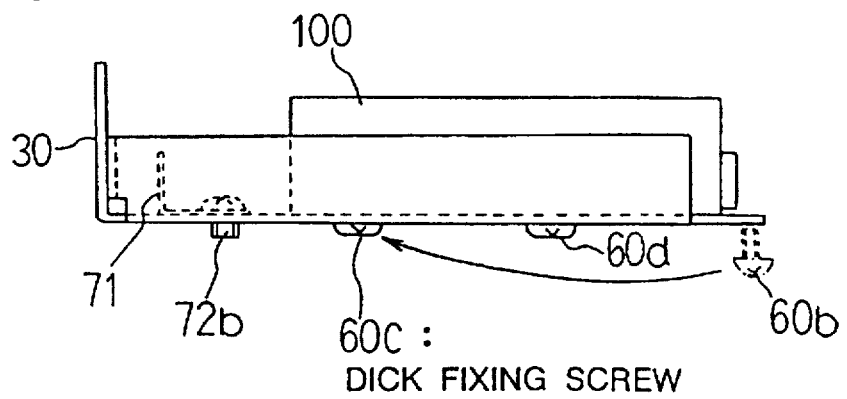
FIG. 18C shows the tray providing the connector cover and the screw hole for position setting.

FIGS. 18A to 18C show a tray providing a screw hole for position setting and the connector cover.

According to FIG. 18A, the tray 30 mounts the connector cover 71 on the tray 30 by using the cover fixing screws 72a and 72b. The connector cover 71 can be removed from the tray 30 by removing the screws 72a and 72b from the screw holes. The tray 30 provides the screw holes 73a and 73b for holding covers in the tray 30 so as to not lose the removed connector cover 71. When the connector cover 71 is mounted on the tray 30 by inserting screws to the screw holes 73a and 73b for holding covers, the connector cover 71 is situated so as not to prevent the magnetic disk unit 100 from being mounted on the tray 30. In FIG. 18B, the cover fixing screws 72a and 72b used for mounting the connector cover 71 on the tray 30 are used as the screws 60b for position setting of the magnetic disk unit by removing the connector cover 71. Furthermore, after mounting the magnetic disk unit 100 on the tray 30 positioned by the screw 60b for position setting, the screw 60b for position setting is removed. As shown in FIG. 18C, the removed screw 60b is used as a disk fixing screw 60c to fix the magnetic disk unit 100 on the tray 30.

As has been described, in embodiment 5, by removing the cover from the tray, connection of the connectors is allowed. By removing the cover, the cover will not disturb connection of the connectors. According to the mechanism for position setting, the position of the magnetic disk unit is precisely set on the tray and the cover prevents dusts from being collected in the connector of the back panel. The screw hole is used both for position setting of the unit and for fixing the cover to the tray. Using the mechanism for holding the cover when the magnetic disk unit is in place, the connector cover will not be lost.

Embodiment 6.

In embodiment 6, the mechanism for mounting units in which the back panel provides the connector cover will be described.

FIG. 19 shows the back panel providing the connector cover.

Figure 20:
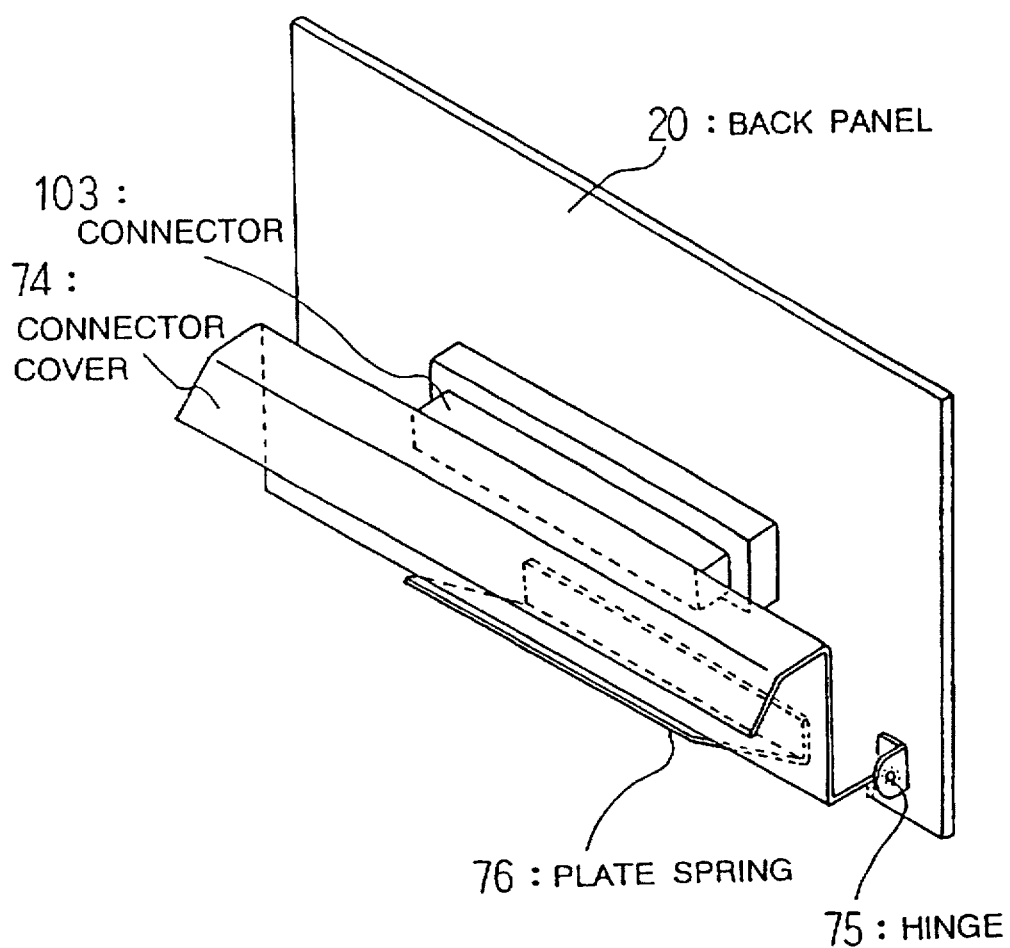
FIG. 20 shows a shape of the connector cover provided in the back panel.

FIG. 20 shows a shape of the connector cover provided in the back panel.

As shown in FIG. 20, the connector cover 74 provided in the back panel 20 can turn upward and downward according to a hinge 75. The plate spring 76, supports the connector cover 74. When the tray 30 carrying the magnetic disk unit 100 is inserted into the frame 105 which mounts the back panel 20 shown in FIG. 20, and as shown in A of FIG. 19, the top of the guide pin 10 contacts with a taper face of the connector cover 74. Furthermore, when the tray 30 is inserted to the end of the frame 105, as shown in B of FIG. 19, the top of the guide pin 10 pushes down the connector cover 74. The pushed down connector cover 74 is supported by the plate spring 76 and, as shown in B of FIG. 19, as it contacts with a part of the guide pin 10. Furthermore, when the tray 30 is pushed to the end of the frame 105 and the connectors 101 and 103 are connected, as shown in C of FIG. 19, the connector cover 74 is retracted below the bottom face of the tray 30 and is supported by the plate spring 76.

As has been described, in embodiment 6, the cover of the connector of the back panel is mounted on the back panel and the simplified structure is realized. Additionally, by retracting the cover automatically, the cover will not disturb the connection of the connector.

Embodiment 7.

Figure 33A:
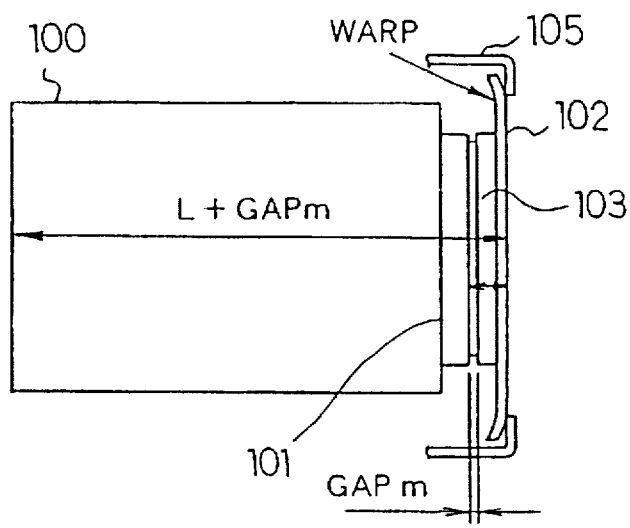
FIG. 33A shows a state which causes a gap between the connectors due to a warp when the connector of the magnetic disk unit and the connector of the back panel are combined.
Figure 33B:
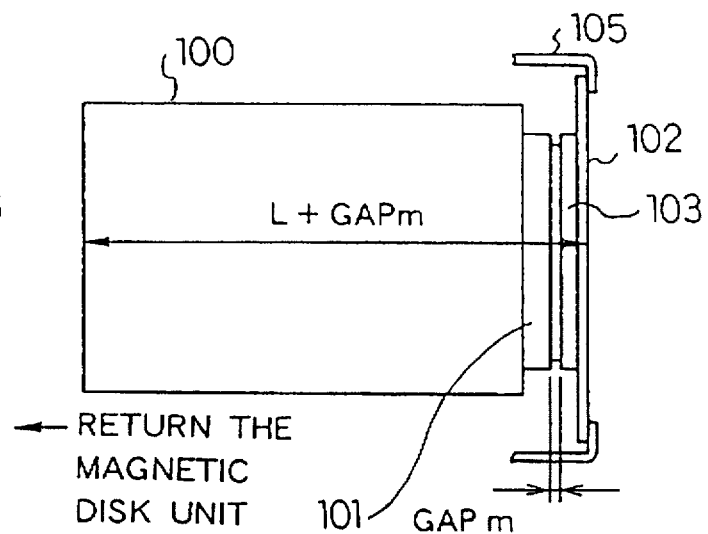
FIG. 33B shows a state which causes a gap between the connectors due to warp when the connector of the magnetic disk unit and the connector of the back panel are combined.
Figure 33C:
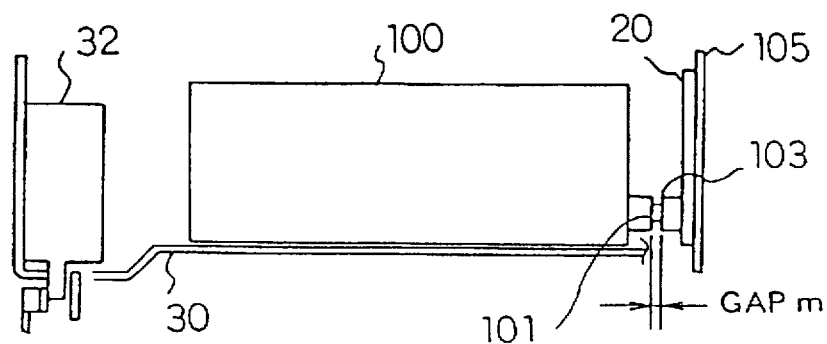
FIG. 33C shows a state which causes a gap between the connectors due to warp when the connector of the magnetic disk unit and the connector of the back panel are combined; and, FIG. 34 shows an allowable range for the position of the connector of the magnetic disk unit according to the SCA method.
Figure 34:
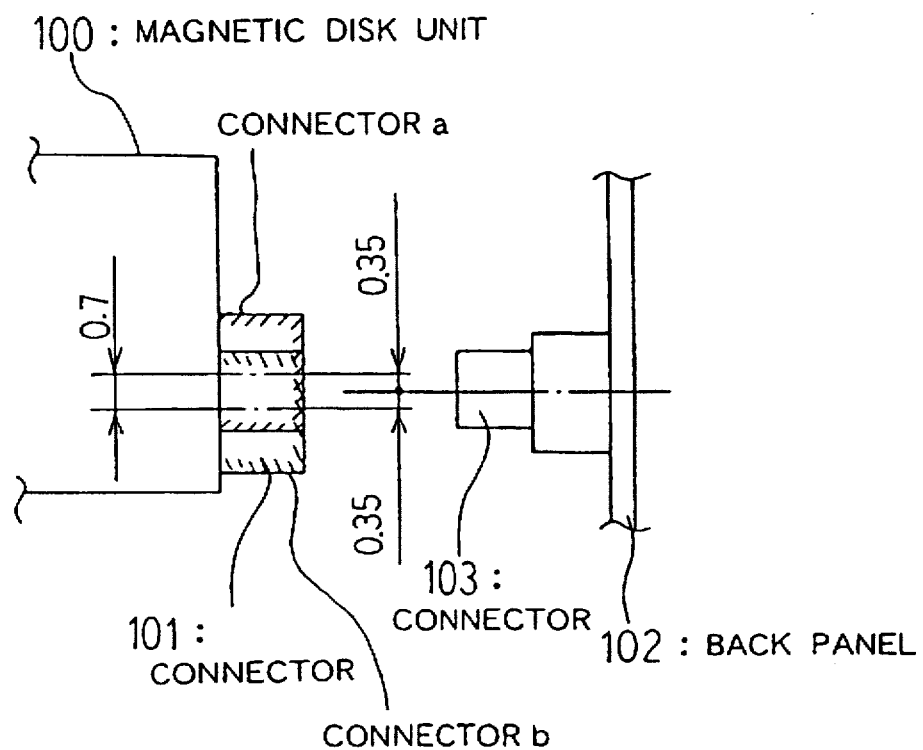

As shown in FIG. 33 described in the Related Art, when the magnetic disk unit 100 is inserted to the end of the frame 105, when the forth to connect the connector 101 of the magnetic disk unit 100 and the connector 103 of the back panel 102 is larger than the strength of the back panel 102, a warp or a bending in the back panel 102 is caused.

For example, in FIG. 33, a warp or a bending of the back panel 102 causes a gap m between the connector 101 and the connector 103.

When a gap m is caused between the connectors 101 and 103, the back panel 102 is positioned in relation to the frame 105 by a gap m. Accordingly, when the tray 30 in embodiments 1 and 2 returns in the opposite direction of insertion, there is a probability of causing a condition wherein the back panel 102 is pressed to the frame 105. For example, in Embodiment 1, the tray 30 returns in the opposite direction of insertion by 0.6 mm. However, in FIG. 31A, when the size from the right end face of the connector 101 of the magnetic disk 100 to the left face of the back panel 102 is more than +0.6 mm, even when the tray 30 returns in the opposite direction of insertion, the back panel 102 is pressed to the frame 105. Therefore, the center part of the back panel 102 is bent and the back panel 102 supports the magnetic disk unit 100.

Figure 21:
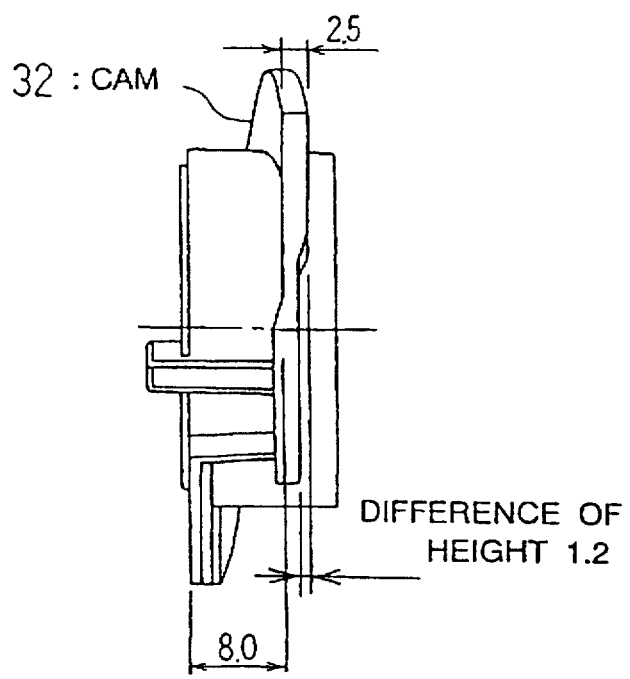
FIG. 21 shows a shape of the cam.

In FIG. 21, a difference of height of the cam 32 is set by adding the gap m. The gap between the connectors, caused because engagement of the connector becomes shallow due to bending of the back panel, is added to the difference of height of the cam. Then, by returning the tray by the gap distance, the back panel is no longer pressed and it is possible to prevent the back panel from supporting the magnetic disk unit. It is possible to calculate statistically what the gap m between the connectors actually is, by actually measuring a plurality of sample components.

Embodiment 8.

In Embodiment 8, there follows an explanation of a case where a supporter to support the back panel 102 is mounted on the frame 105 so that the back panel 102 will not warp or bend, as shown in FIG. 33.

Figure 22A:
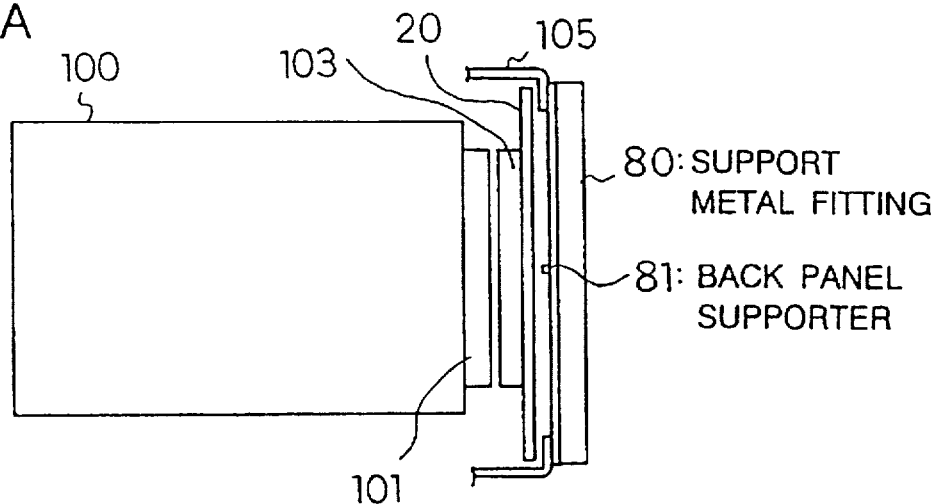
FIG. 22A shows a back panel supporter and a support metal fitting.
Figure 22B:
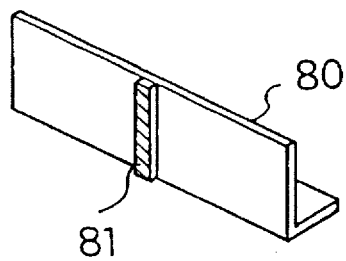
FIG. 22B shows a back panel supporter and a support metal fitting.
Figure 22C:
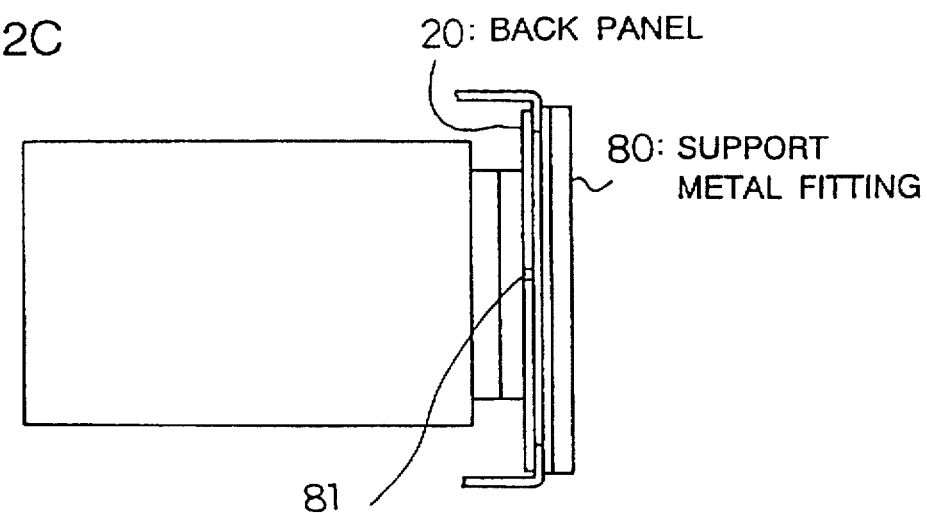
FIG. 22C shows a back panel supporter and a support metal fitting.

FIGS. 22A to 22C show the frame 105 having a back panel supporter.

A mounting mechanism for components according to the present invention, as shown in FIG. 22A, includes a support metal 80 and a back panel supporter 81 to support the back panel on the rear of the frame 105. FIG. 22A shows a top view of the frame 105 to which the magnetic disk unit 100 is inserted. To further explain a shape of the support metal 80 and the back panel supporter 81, FIG. 22B is referred to. FIG. 22B is a perspective view of the support metal and the back panel supporter. The support metal 80, as shown in FIG. 22B, is L-shaped to provide rigidity. Then, the back panel supporter 81 is mounted oblongly around the center of the support metal 80. When the tray 30 carrying the magnetic disk unit 100 is inserted to the frame 105, the back panel 20 contacts the frame 105, as shown in FIG. 22C, the back panel supporter 81 supports the back panel 20 to prevent a warp or a bending of the back panel 102.

As has been described, by mounting the supporter of the back panel on the frame 105 and supporting the back panel at the supporter, it is possible to prevent a warp and a bending of the back panel.

Here, the support metal and the back panel supporter of FIGS. 22A to 22C is an example. If it is structured to prevent a warp or a bending of the back panel 20, a supporter having a structure not like in FIGS. 22A to 22C is applicable.

Embodiment 9.

In Embodiment 1, a shape of the guide pin 10 is shown with reference to FIG. 4. In Embodiment 9, as shown in FIG. 4, the guide pin 10 having the thick body 10a and the thin body 10b is inserted to the guide hole 108 of the back panel 20. An explanation is made here for a case where a maximum value tolerance of +−0.5 mm is allowed in direction of the height of the connector in the SCA specification (Z direction). In this case, the guide pin 10 and the guide hole 108 don't contact.

Figure 23A:
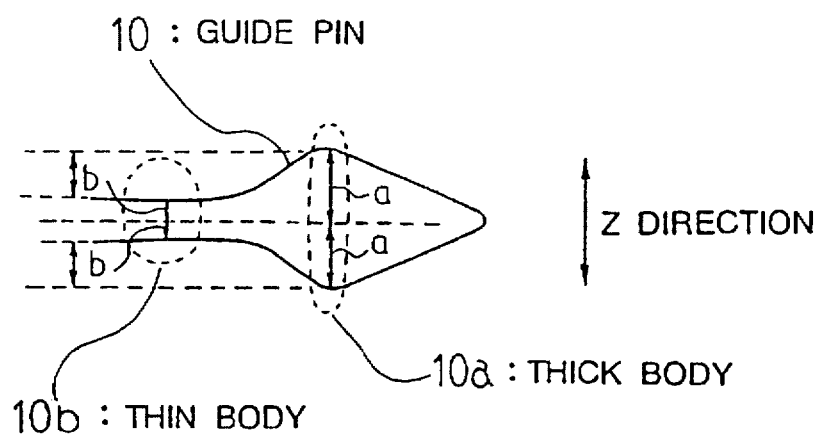
FIG. 23A shows a shape of the guide pin.
Figure 23B:
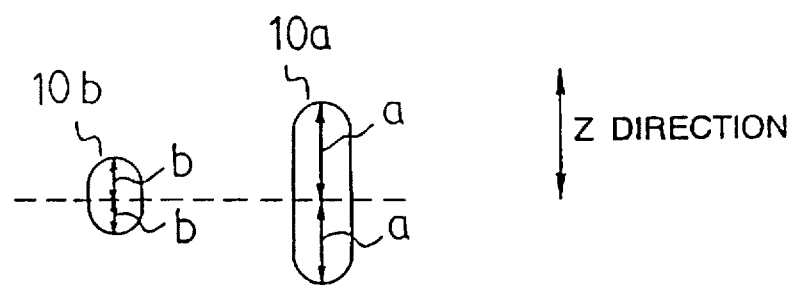
FIG. 23B shows a shape of the guide pin.

FIGS. 23A and 23B show a shape of the guide pin in Embodiment 9. FIG. 23A is a side view of the guide pin 10. According to FIG. 23A, the thick body 10a has a length in the Z direction, that is, direction of height of the connector from the center axis of the guide pin 10. The thin body 10b has a length of b in the Z direction, that is, the direction of height of the connector from the center of the guide pin 10. A difference of length between a and b is more than 0.5 mm, for example 0.6 mm. FIG. 23B is a cross sectional view when the thick body 10a and the thin body 10b are cut in the Z direction. A diameter in the Z direction of the thick body 10a is 2a. A diameter in the Z direction of the thin body 10b is 2b. Therefore, a difference of diameter in the Z direction between the thick body 10a and the thin body 10b is 1.0 mm. The guide pin 10 as shown in FIGS. 23A and 23B is used as a mounting mechanism for components and a mounting mechanism of units in Embodiment 9.

Figure 25A:
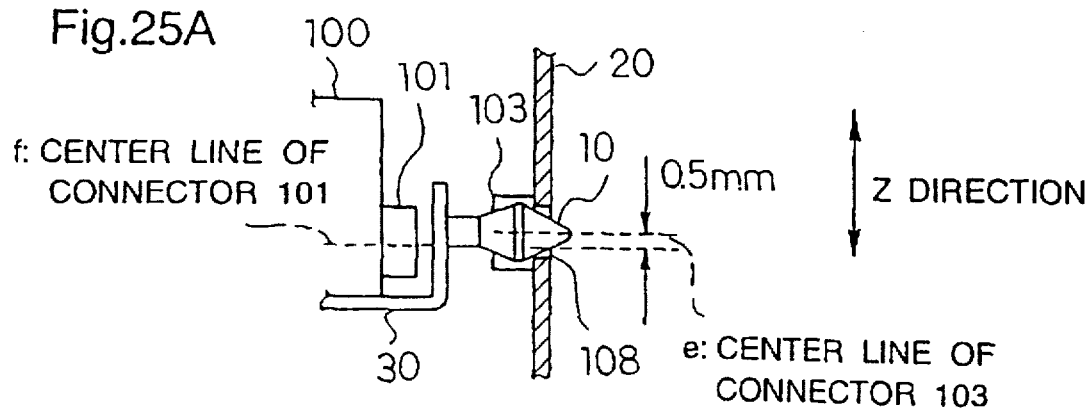
FIG. 25A shows the operation of inserting the guide pin into the guide hole.
Figure 25B:
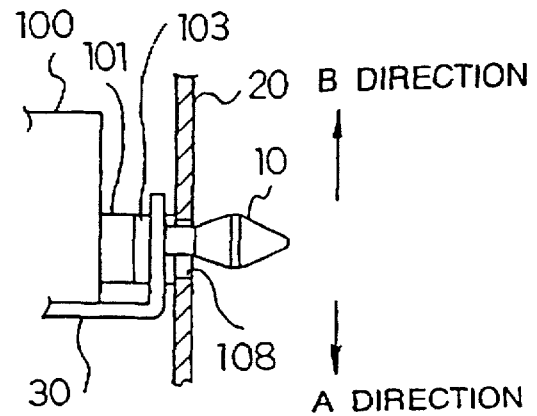
FIG. 25B shows the operation of inserting the guide pin into the guide hole.

FIGS. 25A and 25B show a view of the operation of inserting the guide pin to the guide hole. FIG. 25A is a view in which the guide pin 10 is inserted to the guide hole 108. During insertion, the position setting of the connectors 101 and 103 is performed and released, and then the connectors 101 and 103 are connected. A difference between the diameter φD of the thick body and the diameter φd of the thin body of the guide pin 10 is more than 1.0 mm. Therefore, after the position setting of the connectors 101 and 103 provided by the thick body 10a and the guide hole 108 of the guide pin 10, the connectors 101 and 103 are connected. Simultaneously, the thin body 10b passes through the guide hole 108. Then, there a gap is caused between the thin body, 10b of the guide pin 10 and the guide hole 108. Based on this, the back panel 20 can move in Z direction by more than 0.5 mm.

Figure 24:
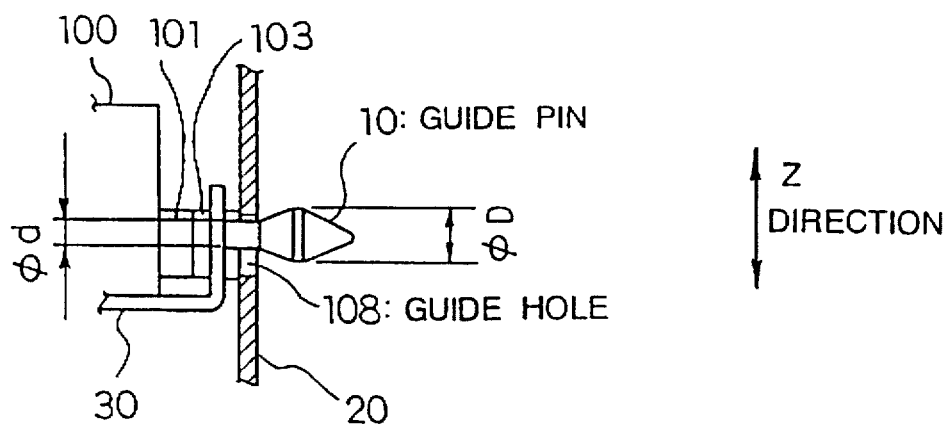
FIG. 24 shows the operation of inserting the guide pin into the guide hole.
Figures 30A, 30B, 30C:
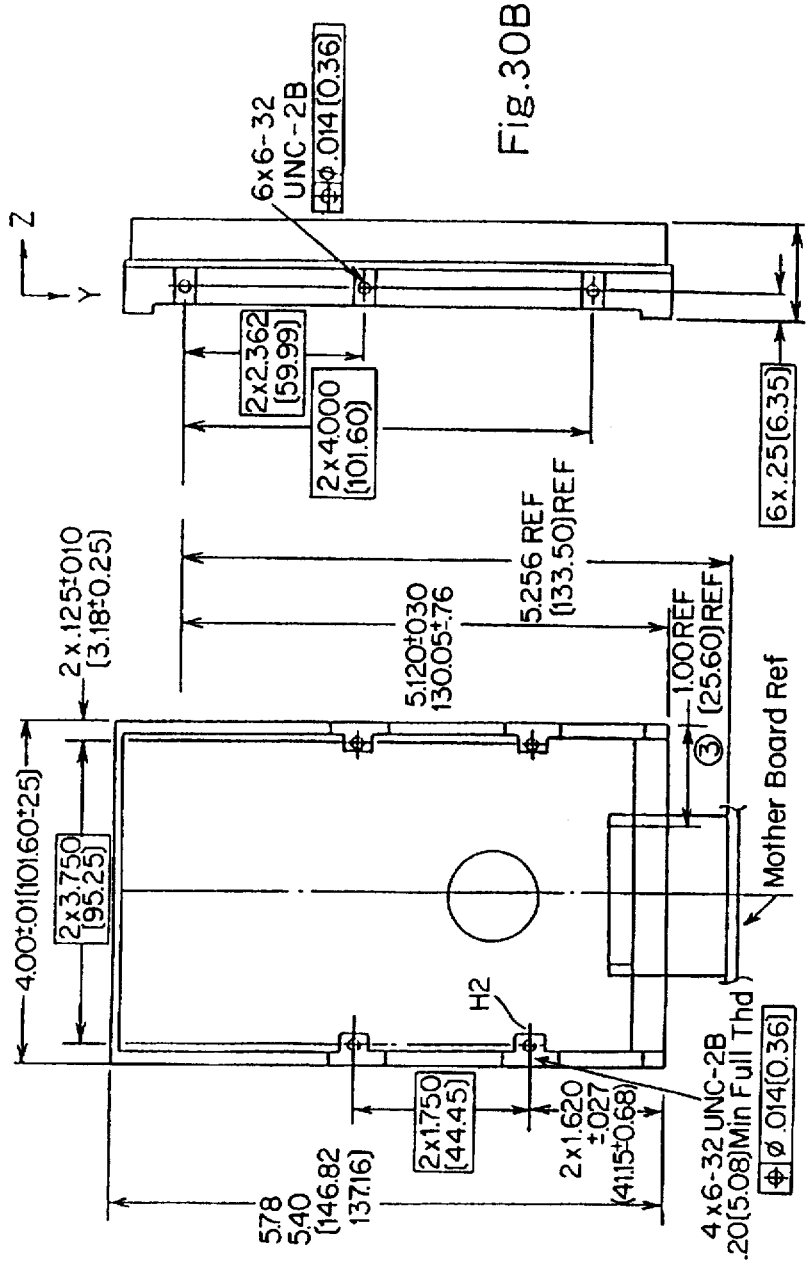
FIG. 30 shows a part of a manual of the SCA method.

For instance, the guide pin 10 having a shape as shown in FIGS. 23A and 23B is being inserted to the guide hole 108, as in FIG. 24. Here, the tray 30 is assumed to carry the magnetic disk unit 100. In accordance with 200 of FIG. 30 described in the related arts, a tolerance of +—0.5 mm is allowed in (z) direction of height of the connector in the SCA specification. Therefore, as shown in FIG. 25A, when the connectors 101 and 103 are connected, when the center line f of the connector 101 is shifted to a center line e of the connector 103 by –0.5 mm, it must be possible to connect the connectors 101 and 103. Under the condition, as shown in FIG. 25A, when the guide pin 10 is being inserted to the guide hole 108, the thick body 10a of the guide pin 10 is guided by the guide hole 108 and the position setting of the connectors 101 and 103 is performed. Furthermore, when the guide pin 10 is further inserted into the guide hole 108, the thin body 10b passes the guide hole 108 and the position setting of the connectors by the guide pin 10 and the guide hole 108 is released. Then, because there is a gap of more than +—0.5 mm between the guide hole 108 and the thin body 10b of the guide pin 10, as shown in FIG. 25B, the back panel 20 can move in A direction more than +—0.5 mm.

As has been described, when the thin body of the guide pin passes the guide hole, compared to a case where the thick body passes the guide hole, there is a gap of more than 0.5 mm from the inside of the guide hole. Therefore, the back panel can move more than 0.5 mm in the Z direction. Based on this, at a maximum value of tolerance allowed in the direction of the height of the connector (Z direction), it is possible to connect the connectors without contacting the guide pin and the guide hole. Furthermore, based on this, it is possible to not add stress to the connector.

In FIG. 25A, the center line f of the connector 101 is shifted by –0.5 mm to the center line e of the connector 103. However, in a case where it is shifted by +0.5 mm, it is also possible to connect the connectors without contacting the guide pin and the guide hole. In this case, when the connectors 101 and 103 are connected, the back panel 20 moves in B direction, which is the opposite of A direction, as shown in FIG. 25B. Then, when the connectors 101 and 103 are connected, it is possible to enter the condition where the guide pin 10 and the guide hole 108 don't contact each other. In addition, it is possible to not add stress to the connectors 101 and 103.

Figure 32A:
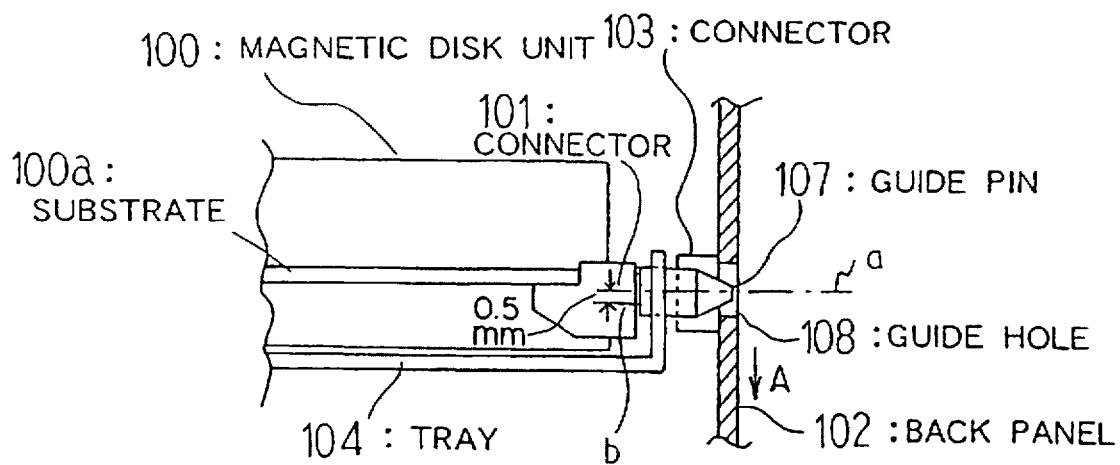
FIG. 32A shows a combine condition of the connector of the magnetic disk unit and the connector of the back panel according to a conventional SCA method.
Figure 32B:
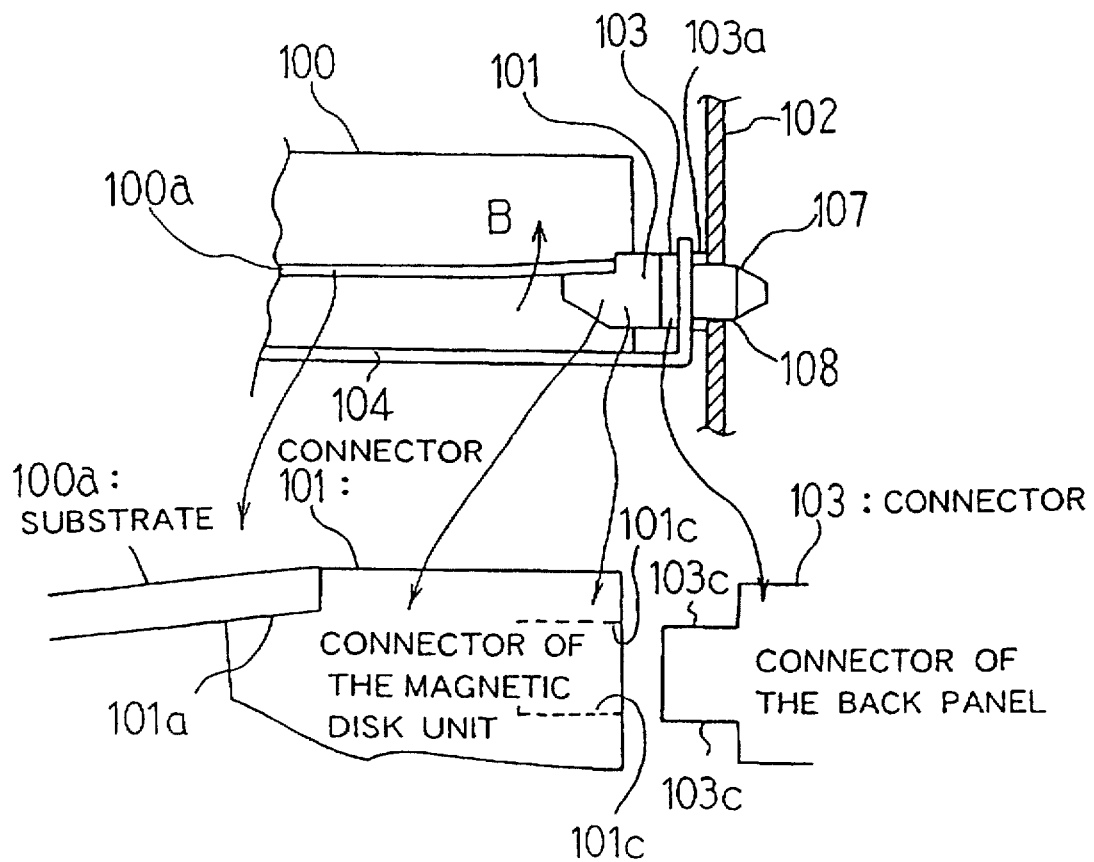
FIG. 32B shows a combine condition of the connector of the magnetic disk unit and the connector of the back panel according to a conventional SCA method.

As has been described, in FIG. 32 of the related arts, when the connectors 101 and 103 are connected, problems are caused in that the guide pin 107 contacts the guide hole 108. Further, there is a problem that stress is added to the connectors 101 and 103. However, based on the shape of the guide pin as shown in FIGS. 23A and 23B, these problems are solved.

Figure 26:
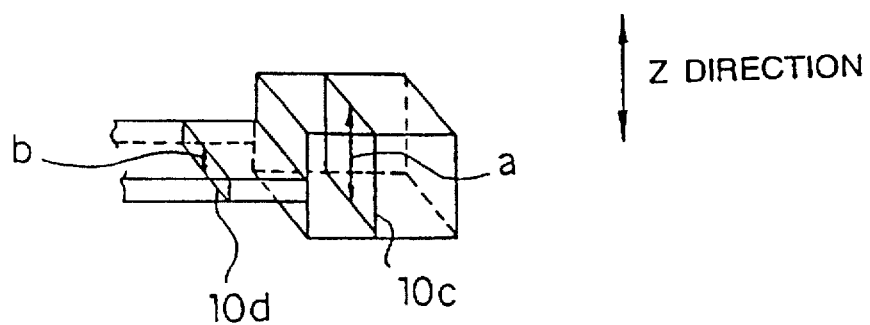
FIG. 26 shows a shape of the guide pin.

As an example of a shape of the guide pin, there is shown a shape of FIG. 23A. However, the guide pin having a shape of FIGS. 10A to 10D in Embodiment 1 is also applicable. When a shape of the guide pin as shown in FIG. 10A is provided, a difference of each of the diameters of the thick body 10a and thin body 10b is assumed to be more than 1 mm. When a shape of the guide pin is as shown in FIG. 10B, the perspective view of the pin is shown in FIG. 26. FIG. 26 shows a cross section 10c in the Z direction of the thick body 10a and a cross section 10d in the Z direction of the thin body 10b. Further, FIG. 26 shows heights a and b parallel in the Z direction of the cross section 10c of the thick body and the cross section 10d of the thin body. The height a of the cross section 10c of the thick body and the height b of the cross section 10d is provided. A difference between height a and height b is assumed to be more than 1.0 mm.

When the guide pin is in the shape as shown in FIG. 10D, a cross section of the thick body 10a and the thin body 10b is as shown in FIG. 23B. Then, a diameter 2 times a (2a) of the thick body 10a and a diameter 2 times b (2b) of the thin body 10b have a difference of more than 1.0 mm.

Embodiment 10.

As shown in FIG. 6A in Embodiment 1, a difference of height of the cam 32 is assumed to be 0.9 mm. However, the tray carrying the magnetic disk unit 100 is returned according to the difference of height in the opposite direction of insertion which is 0.6 mm.

In Embodiment 1, 99.5% of the time the back panel dose not support the magnetic disk unit.

Figure 27:
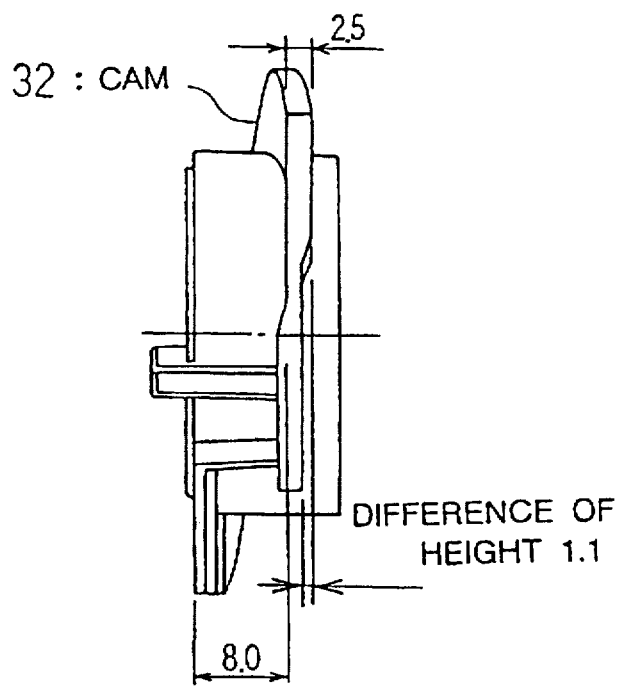
FIG. 27 shows a shape of the cam.
Figure 28:
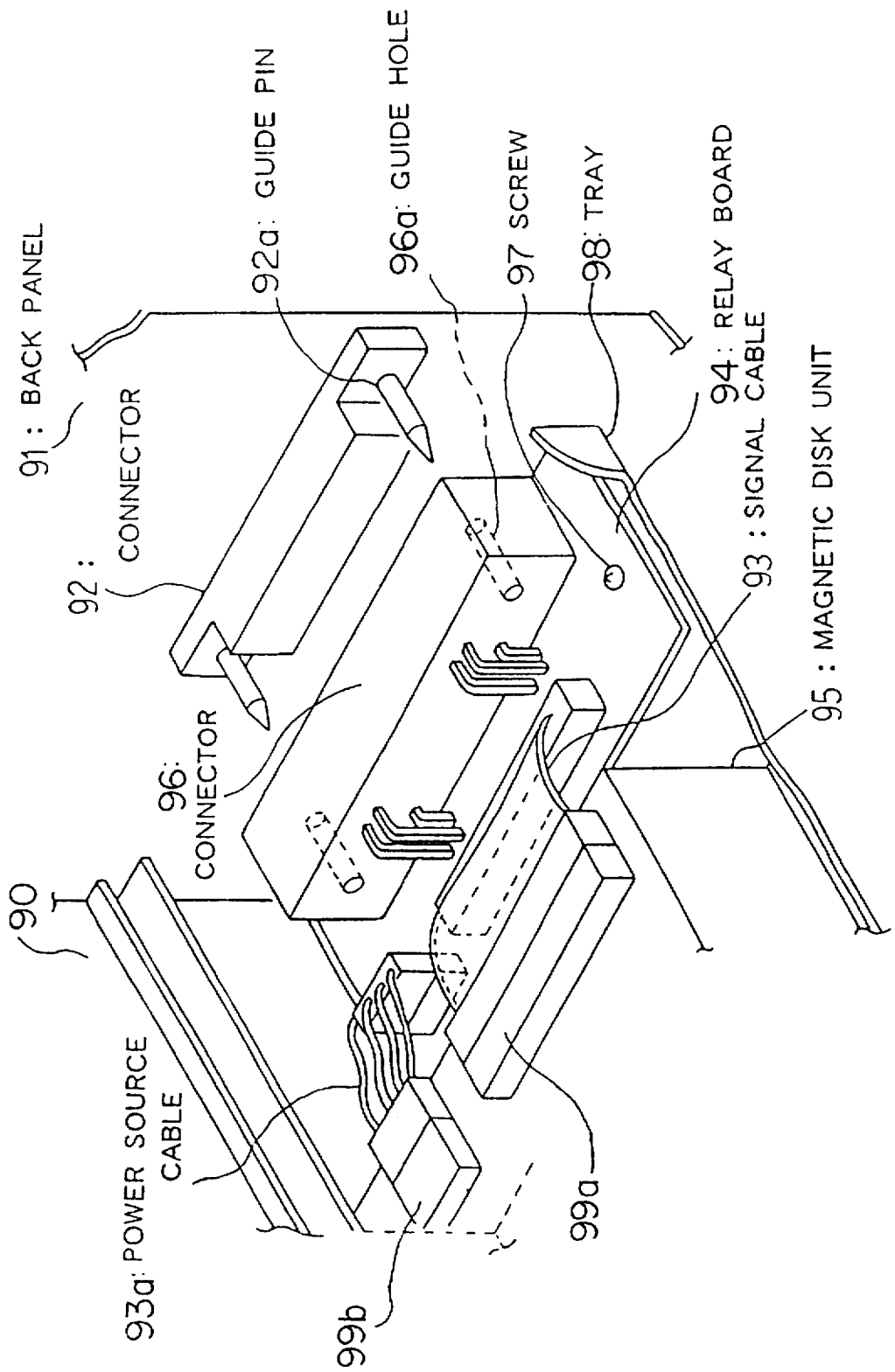
FIG. 28 shows a conventional mounting mechanism for components.
Figure 29:
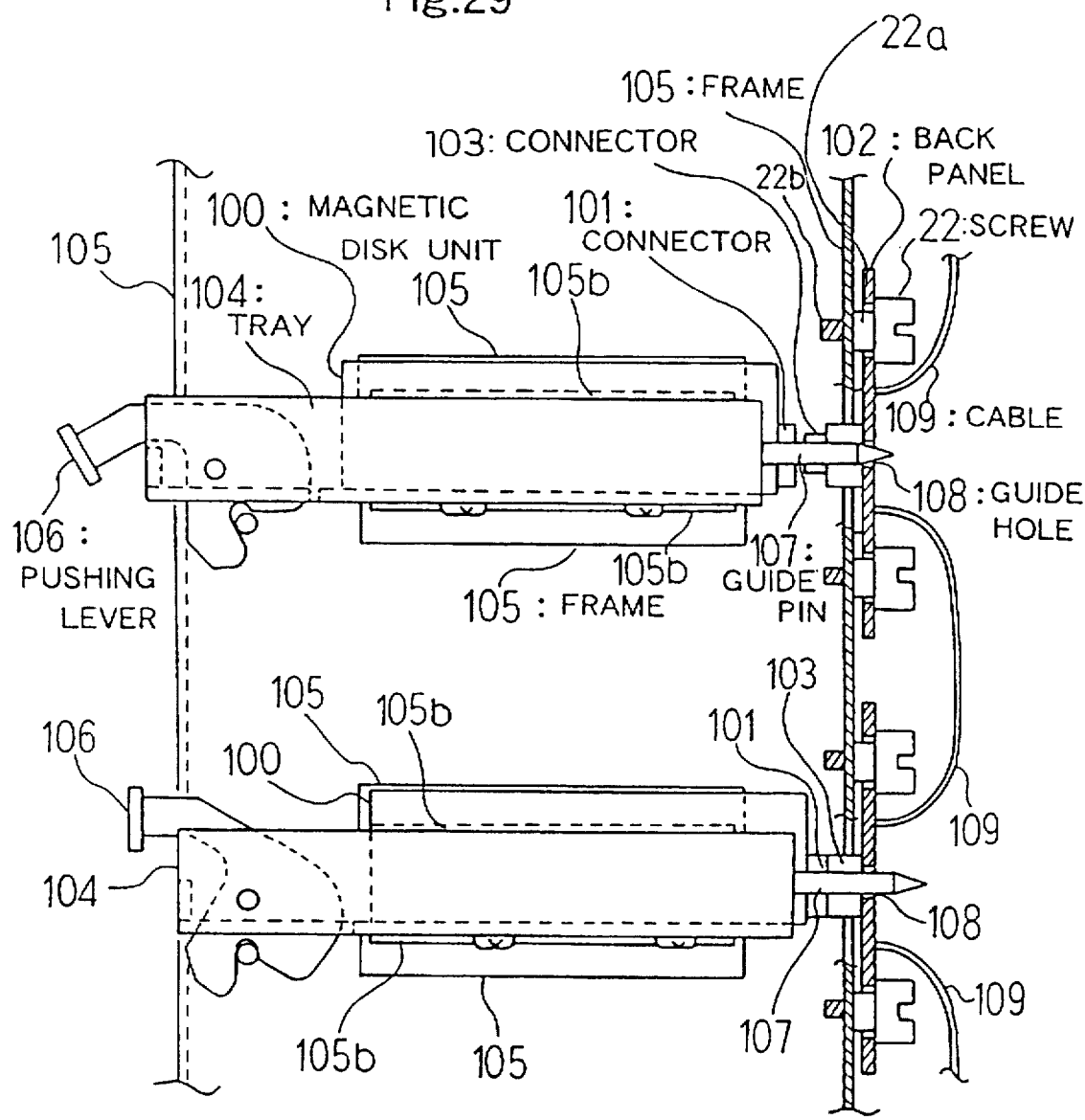
FIG. 29 shows a view when a back panel is divided and each of the back panels is combined by using a cable.

As shown in FIG. 27, a difference of height of the cam 32 is assumed to be 1.1 mm and by returning the tray 30 in the opposite direction of insertion by 0.8 mm, when a distance from the right end face of the connector 101 of the magnetic disk unit 100 to the left face of the back panel 102 is a maximum value of 0.7 mm, the back panel does not support the magnetic disk unit.

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only, and not intended to be limiting. The invention is limited only as defined in the following claims and the equivalents thereto.

What is claimed is:

1. A combination of a mounting mechanism and two components respectively having a first electrical connector and a second electrical connector, comprising:

(a) a first component having a guide pin, wherein the guide pin has a thick body portion towards an outer end of the guide pin and a thin body portion towards an inner end of the guide pin;

(b) a second component having a guide part to guide the thick body portion guide pin for leading the first connector to the second connector and to disengage from the guide pin at the thin body portion when the first and second connectors are connected; and (c) a frame for mounting the first and second components when the first and second connectors are connected.

2. The combination of claim 1, wherein the first component includes an electric device having the first connector and a tray having the guide pin, wherein the tray carries the electric device.

3. The combination of claim 1, wherein the frame mounts the second component in such a way that the second component has a fixed amount of movement relative to the frame normal to a direction of connecting the first connector to the second connector.

4. The combination of claim 3, wherein the guide part is a guide hole sized larger than the thick body portion to accept the guide pin, wherein the thick body portion and the thin body portion are arranged so that the thick body portion of the guide pin is within the guide hole when the first and second connectors are being connected and the thin body portion of the guide pin is within the guide hole when the first and the second connectors have been fully connected.

5. A mounting mechanism for a unit comprising a magnetic disk unit having a first electrical connector in accordance with a SCA specification, comprising:

a tray for carrying the magnetic disk unit;

a frame having at least than one shelf for installing the tray;

a back panel mounted on the frame with a second electrical connector adapted to connect to the first connector of the magnetic disk unit, the back panel being mounted to be able to move back and forth, left and right and up and down a fixed amount, wherein the back panel has at least one guide hole, and at least one guide pin mounted on the tray to fit into the at least one guide hole, wherein the at least one guide pin body has a thick portion fitting within the guide hole towards an outer end of the at least one guide pin body and a thin portion towards an inner end, wherein the inner end is an end closest to the tray, wherein the thin portion of the guide pin is disengaged from the perimeter of the guide hole when the first and second connectors are connected, so that the back panel is moveable relative to the guide pin.

6. The mounting mechanism of the unit of claim 5, wherein the guide pin body thick portion and the guide pin body thin portion have a difference in thickness of more than 0.5 mm.

* * * * *